(12) United States Patent
You et al.

(10) Patent No.: US 12,733,231 B2
(45) Date of Patent: Sep. 8, 2026

(54) METHOD OF MANUFACTURING SEMICONDUCTOR DEVICE WITH REDUCED CELL WIDTH

(71) Applicant: TAIWAN SEMICONDUCTOR MANUFACTURING COMPANY, LTD., Hsinchu (TW)

(72) Inventors: Jia-Chuan You, Taoyuan County (TW); Chia-Hao Chang, Hsinchu City (TW); Kuo-Cheng Chiang, Hsinchu County (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 557 days.

(21) Appl. No.: 18/106,812

(22) Filed: Feb. 7, 2023

(65) Prior Publication Data

US 2024/0113199 A1 Apr. 4, 2024

Related U.S. Application Data

(60) Provisional application No. 63/412,788, filed on Oct. 3, 2022.

(51) Int. Cl.
*H10D 64/01* (2025.01)
*H10D 30/01* (2025.01)
(Continued)

(52) U.S. Cl.
CPC ......... *H10D 64/015* (2025.01); *H10D 30/014* (2025.01); *H10D 30/031* (2025.01);
(Continued)

(58) Field of Classification Search
CPC .. H10D 64/015; H10D 30/014; H10D 30/031; H10D 30/43; H10D 30/6729;
(Continued)

(56) References Cited

U.S. PATENT DOCUMENTS 9,236,267 B2 1/2016 De et al.
9,502,265 B1 11/2016 Jiang et al.
(Continued)

OTHER PUBLICATIONS

Hobbs, Neil Townsend. Anisotropic etching for silicon micromachining. Diss. Virginia Tech, 1994. (Year: 1994).*

*Primary Examiner* — Norman D Richards
*Assistant Examiner* — Ethan Edward Cutler
(74) *Attorney, Agent, or Firm* — STUDEBAKER BRACKETT PLLC

(57) ABSTRACT

A method of manufacturing a semiconductor device includes forming a gate electrode structure over a channel region, wherein the gate electrode structure includes a gate dielectric layer disposed over the first channel region, a gate electrode disposed over the gate dielectric layer, and insulating spacers disposed over opposing sidewalls of the gate electrode, wherein the gate dielectric layer is disposed over opposing sidewalls of the gate electrode. An interlayer dielectric layer is formed over opposing sidewalls of the insulating spacers. The insulating spacers are removed from an upper portion of the opposing sidewalls of the gate electrode to form trenches between the opposing sidewalls of the upper portion of the gate electrode and the interlayer dielectric layer, and the trenches are filled with an insulating material.

20 Claims, 32 Drawing Sheets

(51) Int. Cl.

| | |
|---|---|
| ***H10D 30/43*** | (2025.01) |
| ***H10D 30/67*** | (2025.01) |
| ***H10P 50/28*** | (2026.01) |
| ***H10P 50/64*** | (2026.01) |

(52) U.S. Cl.
CPC ......... *H10D 30/43* (2025.01); *H10D 30/6729* (2025.01); *H10D 30/6735* (2025.01); *H10D 64/017* (2025.01); *H10D 64/021* (2025.01); *H10P 50/283* (2026.01); *H10P 50/642* (2026.01)

(58) Field of Classification Search
CPC ............. H10D 30/6735; H10D 64/017; H10D 64/021; H10D 30/6757; H10D 30/797; H10D 62/822; H01L 21/30604; H01L 21/31116
See application file for complete search history.

(56) References Cited

U.S. PATENT DOCUMENTS

| | | | | |
|---|---|---|---|---|
| 9,520,466 | B2 | 12/2016 | Holland et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 9,786,774 | B2 | 10/2017 | Colinge et al. | |
| 9,853,101 | B2 | 12/2017 | Peng et al. | |
| 9,881,993 | B2 | 1/2018 | Ching et al. | |
| 2019/0123163 | A1* | 4/2019 | Yang .................... | H10D 30/014 |
| 2021/0273047 | A1* | 9/2021 | Kuan ................... | H10D 62/151 |

* cited by examiner 97
84
82
45b
45a
86

45b
45a
86
84
82

72
45b
45a
84
82
Z
X

METHOD OF MANUFACTURING SEMICONDUCTOR DEVICE WITH REDUCED CELL WIDTH

RELATED APPLICATION

This application claims priority to U.S. Provisional Application No. 63/412,788, filed Oct. 3, 2022, the entire disclosure of which is incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET) including a fin FET (FinFET) and a gate-all-around (GAA) FET. In a FinFET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. In a GAA FET, all side surfaces of the channel region are surrounded by the gate electrode, which allows for fuller depletion in the channel region and result in less short-channel effects due to steeper sub-threshold current swing (SS) and smaller drain induced barrier lowering (DIBL). As transistor dimensions are continually scaled down to sub 20-25 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A is a cross sectional view along the X direction (source-drain direction), FIG. 1B is a cross sectional view corresponding to Y1-Y1 of FIG. 1A, FIG. 1C is a cross sectional view corresponding to Y2-Y2 of FIG. 1A and FIG. 1D shows a cross sectional view corresponding to Y3-Y3 of FIG. 1A.

DETAILED DESCRIPTION

Figure 1A:
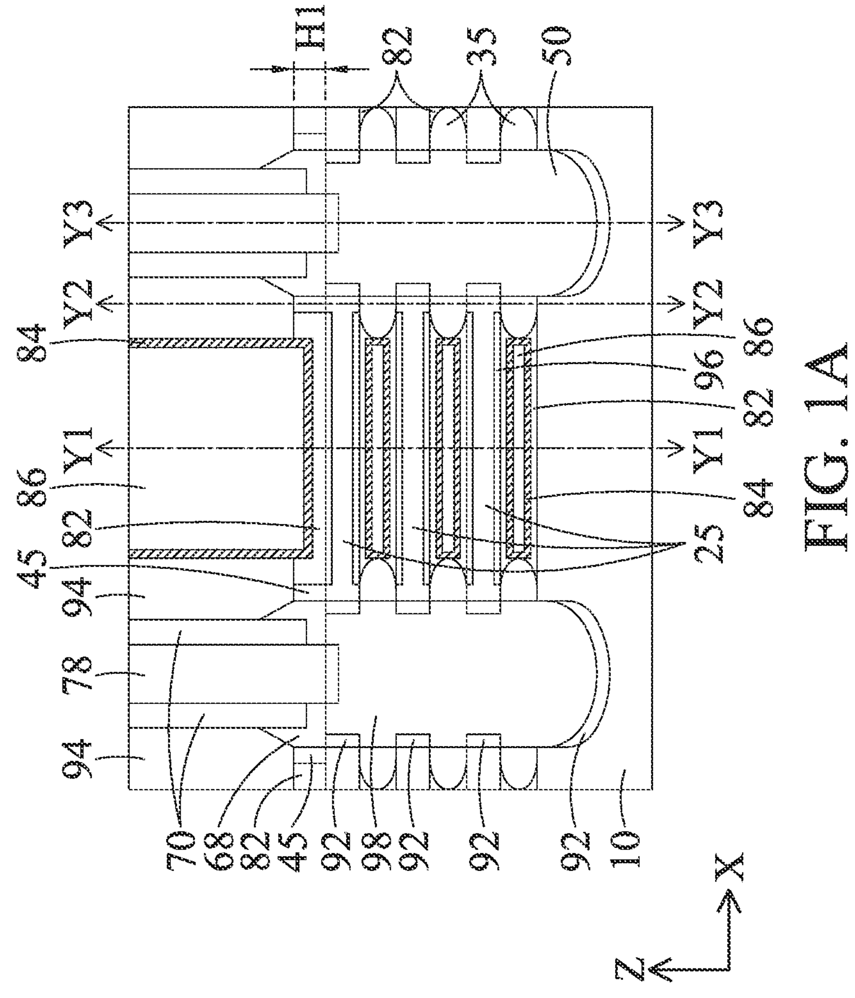
FIGS. 1A-1D show various views of a GAA FET semiconductor device.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Further, in the following fabrication process, there may be one or more additional operations in between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. In the entire disclosure, a source and a drain are interchangeably used, and a source/drain refers to one of or both of the source and the drain. In the following embodiments, materials, configurations, dimensions, processes and/or operations as described with respect to one embodiment (e.g., one or more figures) may be employed in the other embodiments, and detailed description thereof may be omitted. Source/drain structure(s) may refer to a source or a drain, individually or collectively dependent upon the context.

Disclosed embodiments relate to a semiconductor device, in particular, a gate structure of a gate-all-around field effect transistor (GAA FET) and a stacked channel FET and their manufacturing methods.

In embodiments of the disclosure, the contact isolation architecture of a GAA FET is optimized to reduce time-dependent dielectric breakdown (TDDB) and increase the performance of the GAA FET. Embodiments of the disclosure provide a thicker isolation layer surrounding the source/drain contacts, and allow the GAA FET to operate at lower power, thus less heat is generated, and electrical conductivity of the device is increased.

Figure 1D:
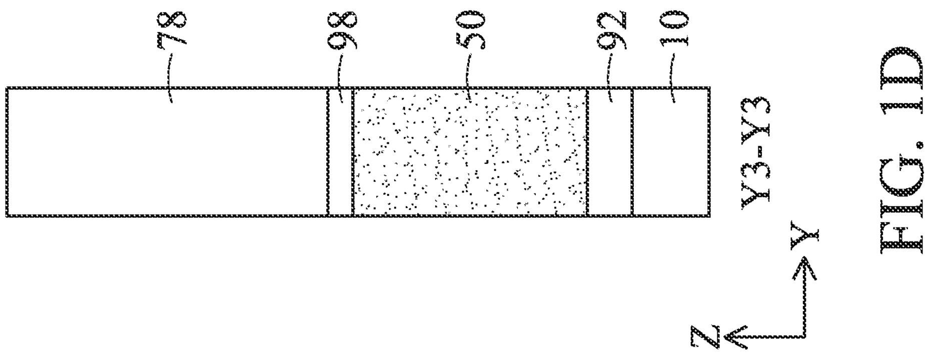
Figure 1C:
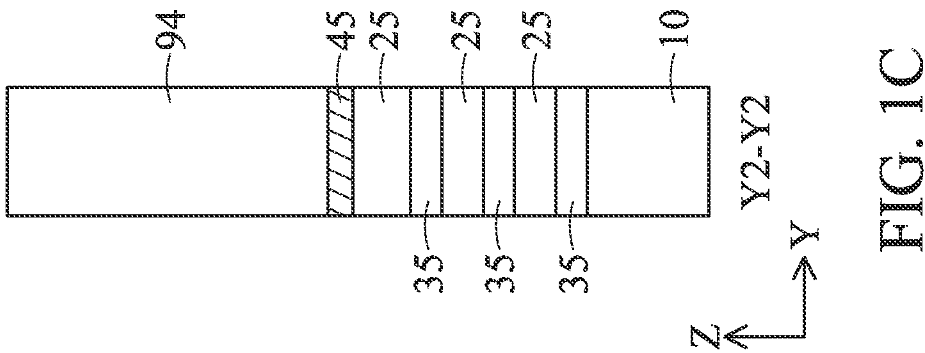
Figure 1B:
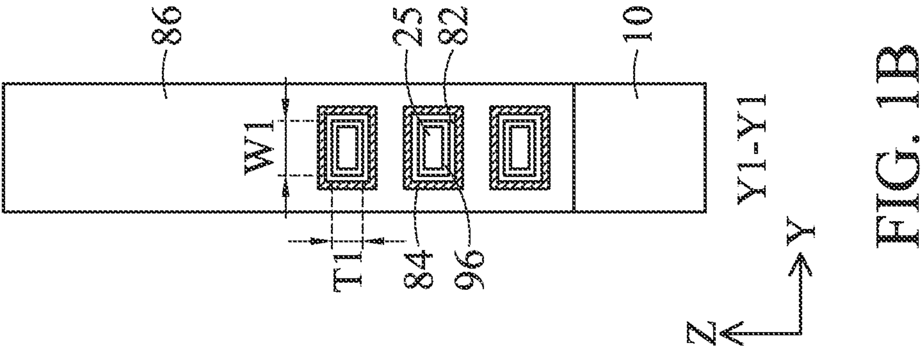

FIGS. 1A-1D are schematic illustrations showing various views of a GAA FET semiconductor device according to an embodiment of the present disclosure. FIG. 1A is a cross sectional view along the X direction (source-drain direction), FIG. 1B is a cross sectional view corresponding to Y1-Y1 of FIG. 1A, FIG. 1C is a cross sectional view corresponding to Y2-Y2 of FIG. 1A and FIG. 1D shows a cross sectional view corresponding to Y3-Y3 of FIG. 1A. In some embodiments, the GAA FET semiconductor device of FIGS. 1A-1D is a p-type FET.

As shown in FIGS. 1A-1C, semiconductor nanostructures 25 are provided over a semiconductor substrate 10, and vertically arranged along the Z direction (the normal direction to the principal surface of the substrate 10). In some embodiments, the substrate 10 includes a single crystalline semiconductor layer on at least its surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. The substrate 10 may include various regions that have been suitably doped with impurities (e.g., p-type or n-type conductivity). The dopants are, for example, boron ($BF_2$) for an n-type Fin FET and phosphorus for a p-type Fin FET in some embodiments. In certain embodiments, the substrate 10 is made of crystalline Si.

The substrate 10 may include in its surface region, one or more buffer layers (not shown). The buffer layers can serve to gradually change the lattice constant from that of the substrate to that of the source/drain structures. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 includes silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

As shown in FIGS. 1A-1C, the semiconductor nanowires or nanosheets (collectively nanostructures) 25, which are channel layers, are disposed over the substrate 10. In some embodiments, the semiconductor nanostructures 25 are disposed over a fin structure 11 (see, FIG. 3) protruding from the substrate 10 (a bottom fin structure 11). Each of the channel layers 25 is wrapped around by a gate dielectric layer 82, and one or more conductive layers including one or more work function adjustment layers 84 and a gate electrode layer 86. The thickness T1 of the semiconductor nanostructures 25 is in a range from about 5 nm to about 60 nm and the width W1 of the semiconductor nanostructures 25 is in a range from about 5 nm to about 80 nm in some embodiments. In some embodiments, the width of the semiconductor wires or sheets is greater than the thickness. In certain embodiments, the width is up to twice or five times the thickness of the semiconductor nanostructures 25. In some embodiments, the semiconductor nanostructures 25 are made of Si, SiGe, or Ge.

Figure 1E:
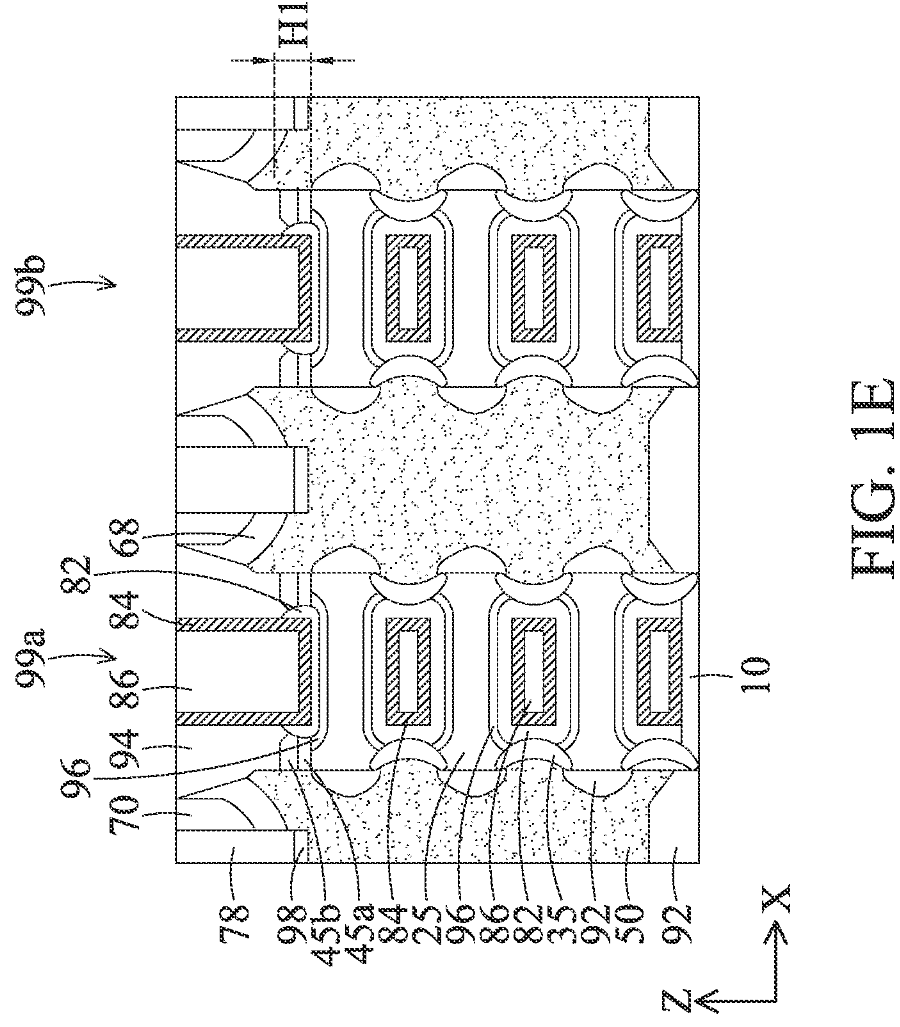
FIG. 1E is a cross sectional view along the source-drain direction of a semiconductor GAA FET device according to an embodiment of the present disclosure.

In some embodiments, an interfacial dielectric layer 96 is formed between the channel of the semiconductor nanostructure 25 and the gate dielectric layer 82 (see FIG. 1E). In some embodiments, the gate dielectric layer 82 includes a high-k dielectric layer. The gate structure includes the gate dielectric layer 82, the gate electrode layer 86 and gate sidewall spacers 45. The gate sidewall spacers 45 are insulating sidewall spacers (or insulating spacers or sidewall spacers) in some embodiments. In some embodiments the gate structure includes a work function adjustment layer 84 disposed between the gate dielectric layer 82 and the gate electrode layer 86.

Although FIGS. 1A-1C and 1E show three semiconductor nanostructures 25, the number of the semiconductor nanostructures 25 is not limited to three, and may be as small as one or more than three, and may be up to ten. By adjusting the number of the semiconductor nanostructures (nanowires, nanosheets . . . etc), a driving current of the GAA FET device can be adjusted.

In some embodiments, source/drain structures 50 are disposed on opposing sides of the gate electrode structure. In some embodiments, an epitaxial layer 92 is disposed on the lateral end face of the nanosheets 25 and exposed surfaces of the lower fin structure 11, as shown in FIG. 1A. Inner spacers 35 separate the gate structure and source/drain structures 50. The inner spacers are made of an insulating material, and may be made of the same material as the gate sidewall spacers 45.

Further, as shown in FIG. 1A, a source/drain (S/D) contact 78 contacts the source/drain structures 50. In some embodiments, the S/D contact 78 includes one or more metal or metallic layers of Ti, TiN, Ta, TaN, Co, W, or an alloy thereof. In some embodiments, as shown in FIG. 1E, a silicide layer 98 is formed on the nanosheets 25 before the S/D contact 78 is formed. In some embodiments, the silicide layer 98 includes WSi, NiSi, TiSi or CoSi or other suitable silicide material or an alloy of a metal element and silicon and/or germanium.

An interlayer dielectric (ILD) layer 70 is disposed over the S/D structure 50 and a conductive contact layer (e.g., plug or bar) 78 passing though the ILD layer 70 is disposed on the S/D structure 50 in some embodiments. In some embodiments, the ILD layer 70 includes one or more layers of insulating material, such as a silicon oxide, a silicon nitride, SiON, SiOC, SiOCN or any other suitable insulating materials.

A refill insulating layer 94 is disposed between an uppermost portion of the gate electrode 86 and the ILD layer 70. The refill insulating layer 94 includes one or more layers of insulating material, such as a silicon oxide, a silicon nitride, SiCN, SiON, SiOCN, or any other suitable insulating materials.

In some embodiments, a contact etch stop layer 68 is disposed between the ILD layer 70 and the gate sidewall spacer 45, the S/D structure 50, and the refill insulating layer 94. In some embodiments, the contact etch stop layer 68 includes one or more layers of silicon nitride, SiON, SiOC, SiOCN, or any other suitable insulating materials.

In some embodiments, the gate dielectric layer 82 extends a height H1 of about 1 nm to about 20 nm above an uppermost semiconductor nanostructure 25 along the Z direction. In other embodiments the gate dielectric layer 82 extends the height H1 of about 2 nm to about 10 nm above the uppermost semiconductor nanostructure 25 along the Z direction, and extends about 3 nm to about 8 nm above the uppermost nanostructure 25 in yet other embodiments. In some embodiments, the gate sidewall spacers 45 extend a height H1 of about 1 nm to about 20 nm above an uppermost semiconductor nanostructure 25 along the Z direction. In other embodiments the gate sidewall spacers 45 extend the height H1 of about 2 nm to about 10 nm above the uppermost semiconductor nanostructure 25 along the Z direction, and extend about 3 nm to about 8 nm above the uppermost nanostructure 25 in yet other embodiments. In some embodiments, the gate sidewall spacers 45 extend about the same height above the uppermost semiconductor nanostructure 25 as the gate dielectric layer 82.

FIG. 1E is consistent with FIG. 1A, however, two metal gate structures are illustrated in FIG. 1E, forming two GAA FETs, a first GAA FET 99*a* and a second GAA FET 99*b*. One of the S/D structures 50 is shared by the two FETs. FIG. 1E also discloses additional embodiments, such as the silicide layer 98 between the conductive contact layer 78 and the S/D structure 50, two gate sidewall spacer layers 45*a*, 45*b*, the interfacial layer 96, and different structural arrangement of the ILD 70, contact etch stop layer 68, and the refill insulating layer 94 that are within the scope of this disclosure. In some embodiments, the gate sidewall spacer layers 45*a*, 45*b* comprise different materials. For example, one gate sidewall spacer may be an oxide, and the other a nitride. Although not shown in FIG. 1E, in some embodiments, the metal gate structure and the source/drain structures are repeatedly arranged in the X direction in the desired numbers depending on the design requirements.

FIGS. 2 to 19 are schematic illustrations showing various stages of manufacturing a semiconductor FET device according to an embodiment of the present disclosure. It is understood that additional operations can be provided before, during, and after processes shown by FIGS. 2-19, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-1E may be employed in the embodiments of FIGS. 2-19, and detailed explanation thereof may be omitted. Although not shown in FIGS. 2-19, in some embodiments, the gate region and the source/drain structure are repeatedly arranged in the X direction in the desired numbers depending on the design requirements (see, FIGS. 1A and 1E).

Figure 2:
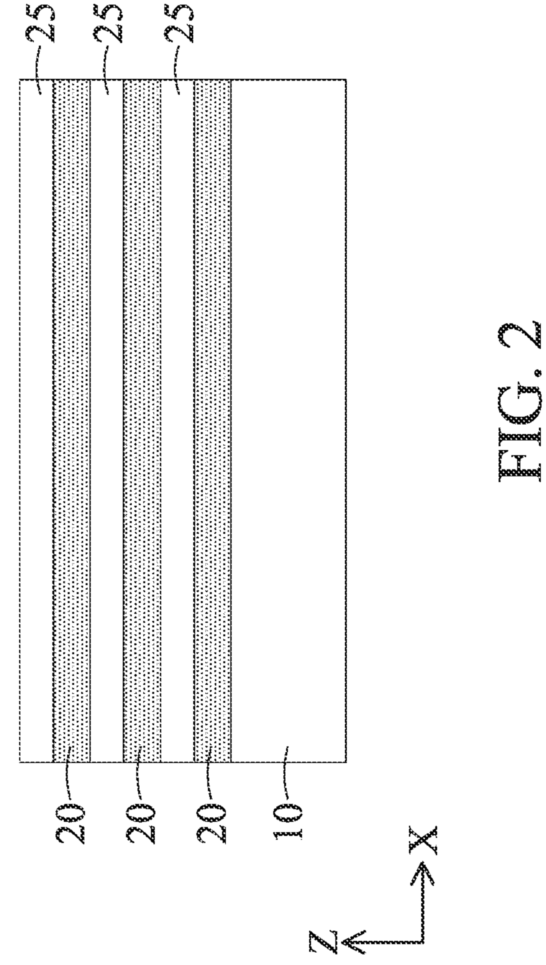
FIG. 2 shows a cross sectional view of one of the various stages of manufacturing a GAA FET semiconductor device according to an embodiment of the present disclosure.

As shown in FIG. 2, first semiconductor layers 20 and second semiconductor layers 25 are alternately formed over the substrate 10. The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP.

In some embodiments, the first semiconductor layers 20 and the second semiconductor layers 25 are made of Si, a Si compound, SiGe, Ge or a Ge compound. In some embodiments, the first semiconductor layers 20 are made of Si. In some embodiments, the first semiconductor layers 20 are made of $Si_{1-x}Ge_x$, where x is equal to or more than about 0.1 and equal to or less than about 0.6, and the second semiconductor layers 25 are Si or $Si_{1-y}Ge_y$, where y is smaller than x and equal to or less than about 0.2. In this disclosure, an "M compound" or an "M based compound" means the majority of the compound is M.

In other embodiments, the second semiconductor layers 25 are made of $Si_{1-x}Ge_x$, where x is equal to or more than about 0.1 and equal to or less than about 0.6, and the first semiconductor layers 20 are made of Si or $Si_{1-y}Ge_y$, where y is smaller than x and equal to or less than about 0.2.

In some embodiments, the second semiconductor layer 25 is made of the same material as the semiconductor substrate 10.

The first semiconductor layer 20 and the second semiconductor layer 25 may be formed by one or more epitaxy or epitaxial (epi) processes. The epitaxy processes include CVD deposition techniques (e.g., vapor-phase epitaxy (VPE) and/or ultra-high vacuum CVD (UHV-CVD)), molecular beam epitaxy, and/or other suitable processes.

The first semiconductor layers 20 and the second semiconductor layers 25 are epitaxially formed over the substrate 10 alternately. The thickness of the first semiconductor layers 20 may be equal to or greater than that of the second semiconductor layers 25, and is in a range from about 4 nm to about 30 nm in some embodiments, and is in a range from about 5 nm to about 15 nm in other embodiments. The thickness of the second semiconductor layers 25 is in a range from about 4 nm to about 30 nm in some embodiments, and is in a range from about 5 nm to about 15 nm in other embodiments. The thickness of the first semiconductor layers 20 may be the same as, or different from the thickness of the second semiconductor layers 25. Although three first semiconductor layers 20 and three second semiconductor layers 25 are shown in FIG. 2, the numbers are not limited to three, and can be one, two, or more than 3, and less than twenty. In some embodiments, the number of the first semiconductor layers 20 is greater by one than the number of the second semiconductor layers 25 (i.e.—the top layer is the first semiconductor layer).

Figure 3A:
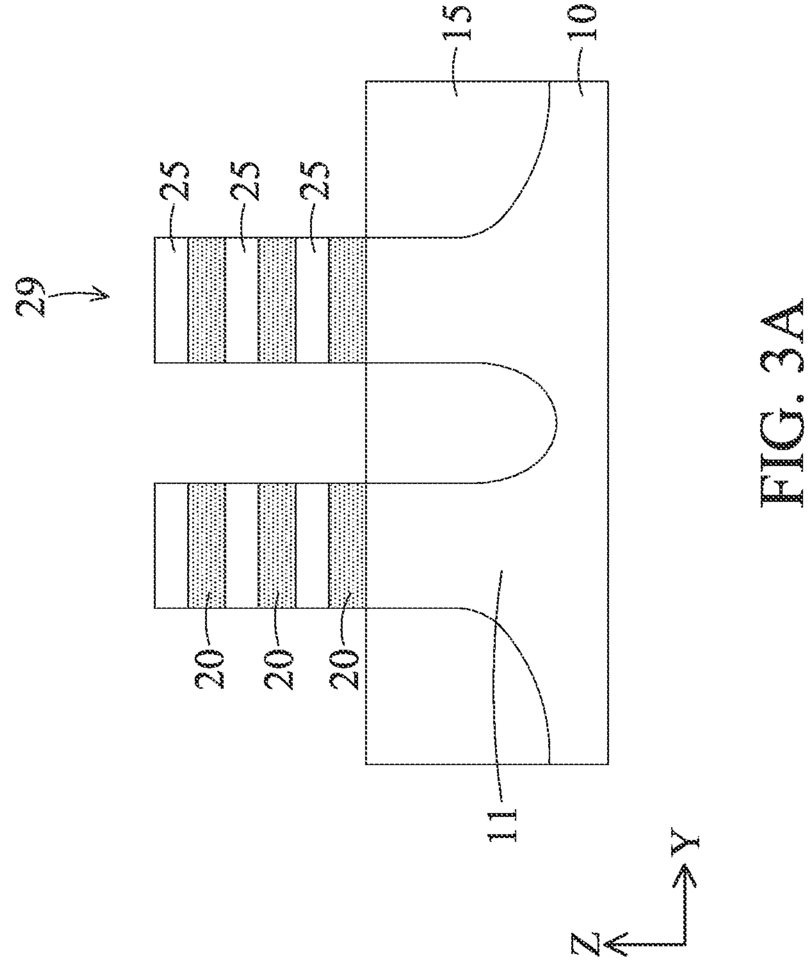
FIG. 3A shows a cross sectional view and FIG. 3B shows an isometric view of one of the various stages of manufacturing a GAA FET semiconductor device according to embodiments of the present disclosure.
Figure 3B:
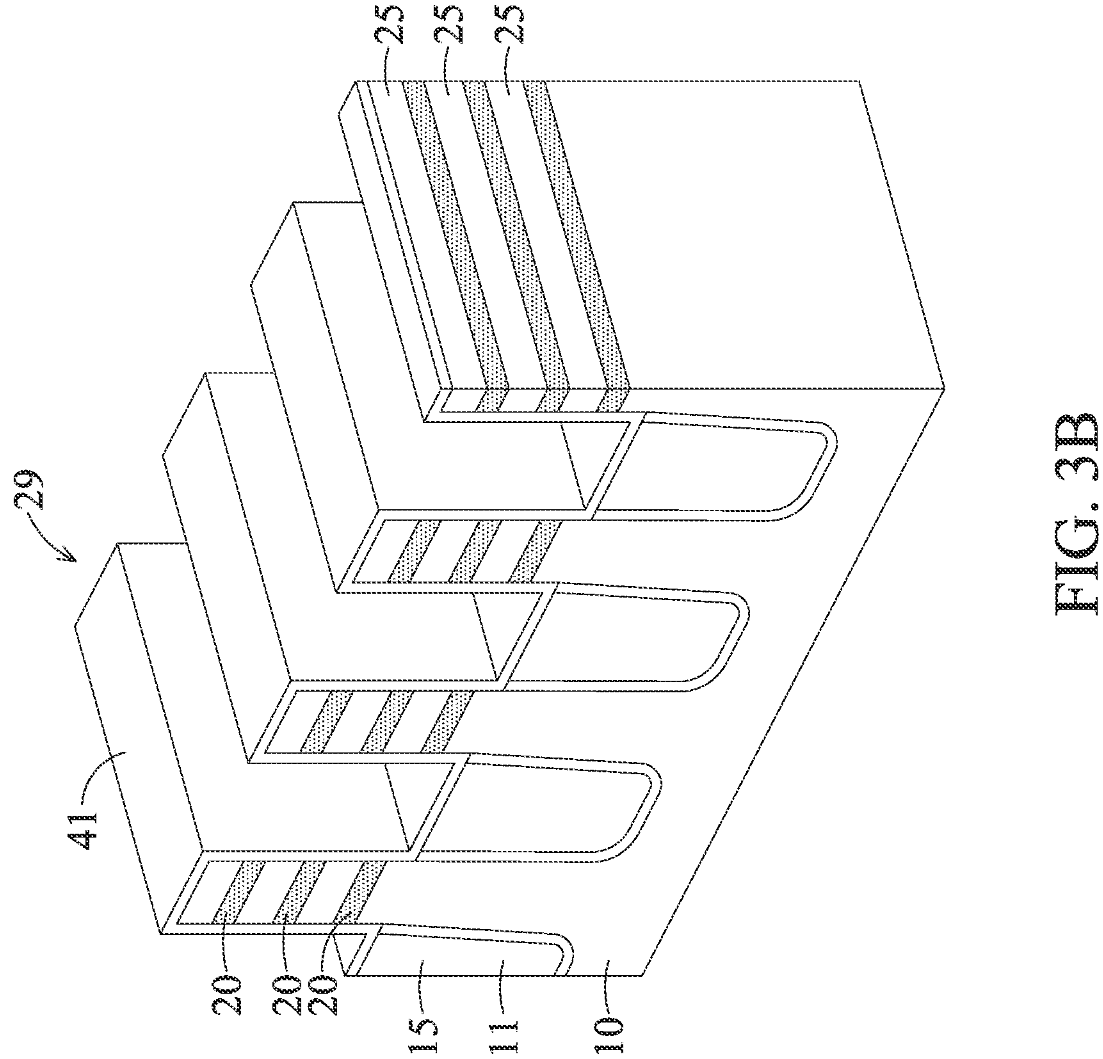

After the stacked semiconductor layers are formed, fin structures 29 are formed by using one or more lithography and etching operations, as shown in FIGS. 3A and 3B. The fin structures may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

As shown in FIG. 3A, the fin structures 29 extend in the X direction and are arranged in the Y direction. The number of the fin structures is not limited to two as shown in FIG. 3A, and may be as small as one and three or more (as shown in FIG. 3B). In some embodiments, one or more dummy fin structures are formed on both sides of the fin structures 29 to improve pattern fidelity in the patterning operations. As shown in FIG. 3A, the fin structures 29 have upper portions constituted by the stacked semiconductor layers 20, 25 and well portions 11 (a mesa structure).

The width of the upper portion of the fin structure 29 along the Y direction is in a range from about 5 nm to about 80 nm in some embodiments, and is in a range from about 10 nm to about 40 nm in other embodiments.

After the fin structures 29 are formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-enhanced CVD (PECVD) or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 25 is exposed from the insulating material layer. In some embodiments, one or more fin liner layers are formed over the fin structures before forming the insulating material layer. In some embodiments, the fin liner layers include a first fin liner layer formed over the substrate 10 and sidewalls of the bottom part of the fin structures 11, and a second fin liner layer formed on the first fin liner layer. The fin liner layers are made of silicon nitride or a silicon nitride-based material (e.g., SiON, SiCN or SiOCN). The fin liner layers may be deposited through one or more processes such as physical vapor deposition (PVD), chemical vapor deposition (CVD), or atomic layer deposition (ALD), although any acceptable process may be utilized.

Then, as shown in FIG. 3A, the insulating material layer is recessed to form an isolation insulating layer 15 so that the upper portions of the fin structures 29 are exposed. With this operation, the fin structures 29 are separated from each other by the isolation insulating layer 15, which is also called a shallow trench isolation (STI). The isolation insulating layer 15 may be made of suitable dielectric materials, such as silicon oxide, silicon nitride, silicon oxynitride, fluorine-doped silicate glass (FSG); low-k dielectrics, such as carbon doped oxides; extreme low-k dielectrics, such as porous carbon doped silicon dioxide; a polymer, such as polyimide; combinations of these, or the like. In some embodiments, the isolation insulating layer 15 is formed through a process such as CVD, flowable CVD (FCVD), or a spin-on-glass process, although any acceptable process may be used.

In some embodiments, the insulating material layer 15 is recessed until the upper portion of the fin structure (well layer) 11 is exposed. In other embodiments, the upper portion of the fin structure 11 is not exposed. The first semiconductor layers 20 are sacrificial layers which are subsequently partially removed, and the second semiconductor layers 25 are subsequently formed into semiconductor wires or sheets as channel layers of a GAA FET. In other embodiments, the second semiconductor layers 25 are sacrificial layers which are subsequently partially removed, and the first semiconductor layers 20 are subsequently formed into semiconductor wires or sheets as channel layers.

FIG. 3B is an isometric view showing a plurality of fin structures 29 separated by shallow trench isolations 15 after a sacrificial gate dielectric layer 41 is formed over the fin structures 29 and over the shallow trench isolation 15.

Figure 4A:
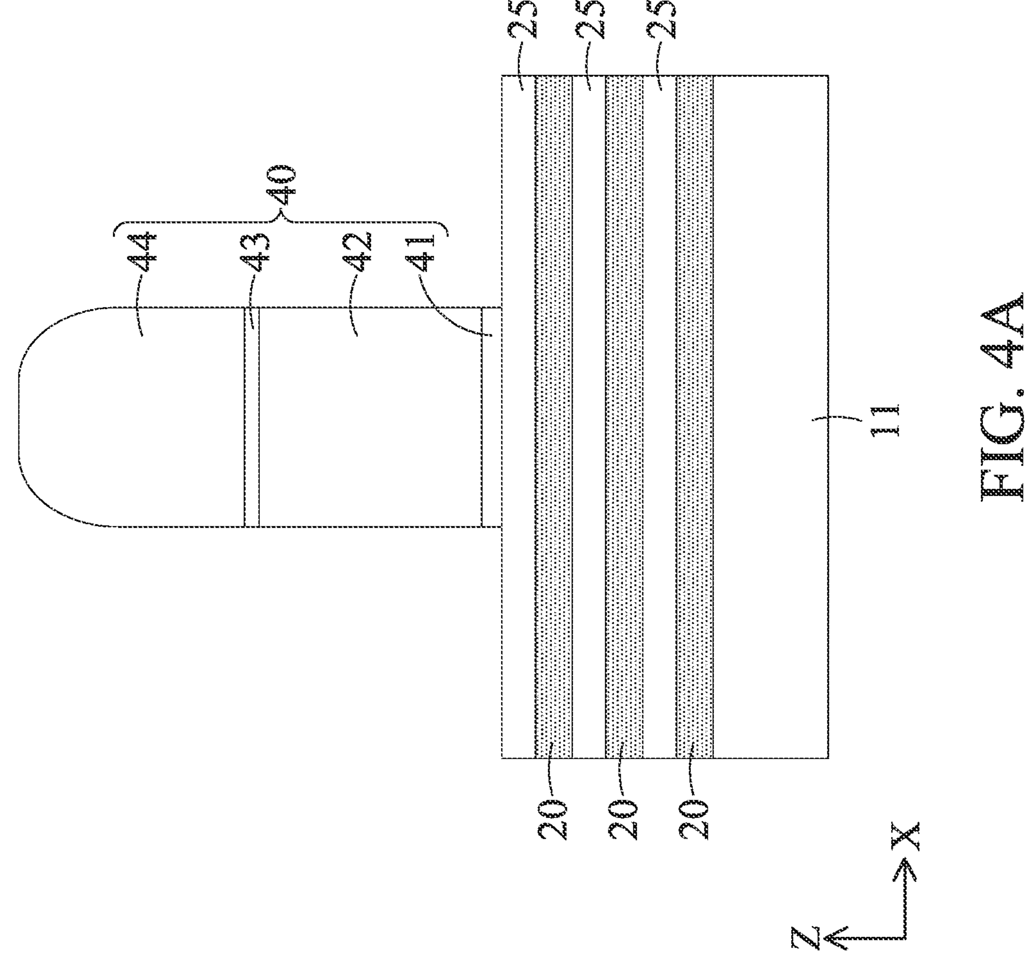
FIG. 4A shows a cross sectional view and FIG. 4B shows an isometric view of one of the various stages of manufacturing a GAA FET semiconductor device according to embodiments of the present disclosure.
Figure 4B:
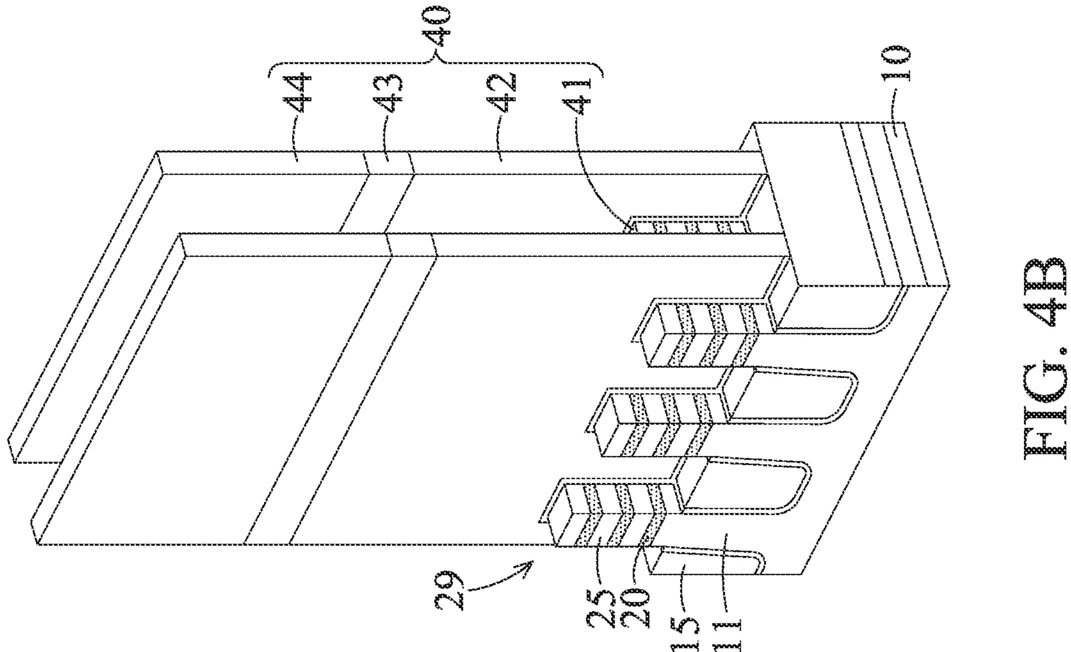

After the isolation insulating layer 15 is formed, a sacrificial (dummy) gate structure 40 is formed. FIGS. 4A and 4B illustrate a structure after a sacrificial gate structure 40 is formed over the exposed fin structures 29. FIG. 4B is an isometric view of the structure. The sacrificial gate structure 40 is formed over a portion of the fin structures 29 which is to be a channel region. The sacrificial gate structure 40 defines the channel region of the GAA FET. The sacrificial gate structure 40 includes a sacrificial gate dielectric layer 41 and a sacrificial gate electrode layer 42. The sacrificial gate dielectric layer 41 includes one or more layers of insulating material, such as a silicon oxide-based material. In one embodiment, silicon oxide formed by CVD is used. The thickness of the sacrificial gate dielectric layer 41 is in a range from about 1 nm to about 5 nm in some embodiments.

The sacrificial gate structure 40 is formed by first blanket depositing the sacrificial gate dielectric layer 41 over the fin structures 29. A sacrificial gate electrode layer 42 is then blanket deposited on the sacrificial gate dielectric layer and over the fin structures, such that the fin structures are fully embedded in the sacrificial gate electrode layer. The sacrificial gate electrode layer 42 includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad silicon nitride layer 43 and a silicon oxide mask layer 44.

Next, a patterning operation is performed on the mask layer and sacrificial gate electrode layer is patterned into the sacrificial gate structure 40, as shown in FIGS. 4A and 4B. The sacrificial gate structure includes the sacrificial gate dielectric layer 41, the sacrificial gate electrode layer 42 (e.g., polysilicon), the pad silicon nitride layer 43 and the silicon oxide mask layer 44. By patterning the sacrificial gate structure, the stacked layers of the first and second semiconductor layers are partially exposed on opposite sides of the sacrificial gate structure, thereby defining source/drain regions, as shown in FIGS. 4A and 4B. In some embodiments, one sacrificial gate structure is formed over one or more fin structures, but the number of the sacrificial gate structures per fin structure is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Figure 5:
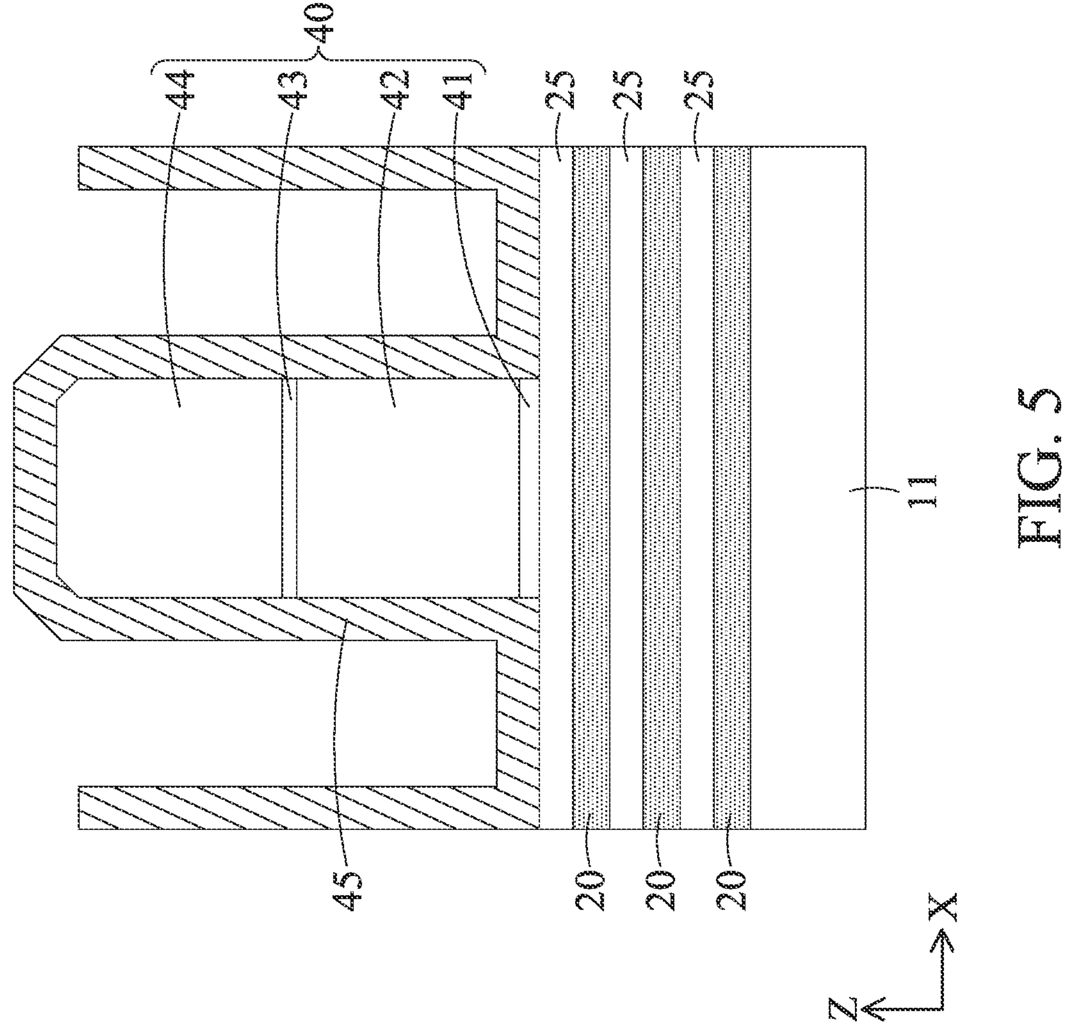
FIG. 5 shows a cross sectional view of one of the various stages of manufacturing a GAA FET semiconductor device according to an embodiment of the present disclosure.

After the sacrificial gate structure 40 is formed, a first cover layer 45 for gate sidewall spacers is formed over the sacrificial gate structure 40, as shown in FIG. 5. The first cover layer 45 is deposited in a conformal manner so that it is formed to have substantially equal thicknesses on vertical surfaces, such as the sidewalls, horizontal surfaces, and the top of the sacrificial gate structure, respectively. In some embodiments, the first cover layer 45 has a thickness in a range from about 5 nm to about 20 nm. The first cover layer 45 includes one or more of silicon nitride, silicon oxide, SiON, SiCN, SiCO, SiOCN or any other suitable dielectric material. The cover layer 45 can be formed by ALD or CVD, or any other suitable method. In some embodiments, one or more additional cover layers are formed over the first cover layer to form multi-layer gate sidewall spacers.

Figure 6:
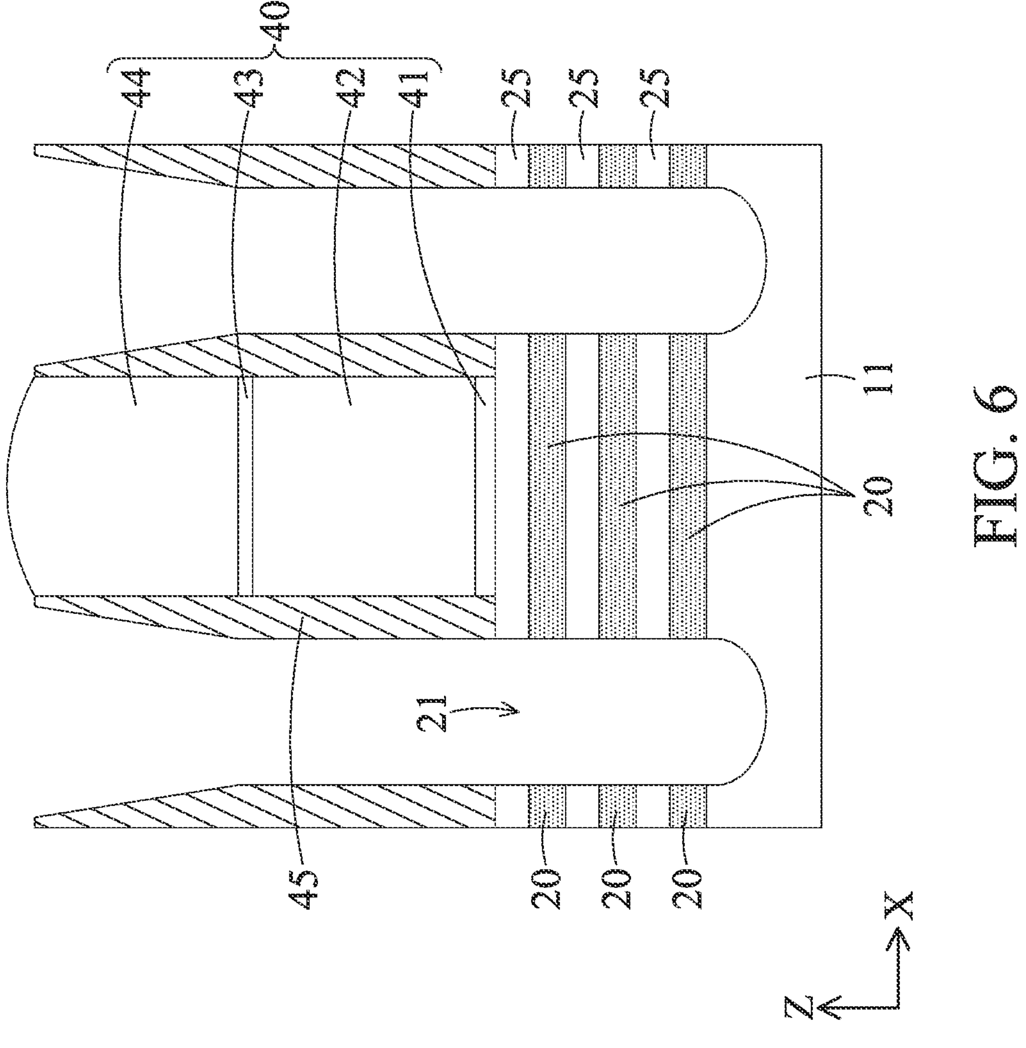
FIG. 6 shows a cross sectional view of one of the various stages of manufacturing a GAA FET semiconductor device according to an embodiment of the present disclosure.

Next, as shown in FIG. 6, the first cover layer 45 is anisotropically etched to remove the first cover layer 45 disposed on the source/drain region, while leaving the first cover layer 45 as sidewall spacers on side faces of the sacrificial gate structure 40. FIG. 6 shows a cross sectional view along the X direction. Then the stacked structure of the first semiconductor layers 20 and the second semiconductor layer 25 is etched down at the source/drain region, by using one or more lithography and etching operations, thereby forming a source/drain space 21. In some embodiments, the substrate 10 (or the bottom part of the fin structures 11) is also partially etched to form a mesa structure. In some embodiments, an n-type FET and a p-type FET are manufactured separately, and in such a case, a region for one type of FET is processed, and a region for the other type of FET is covered by a protective layer, such as a silicon nitride layer. In some embodiments, as shown in FIG. 6, the recessed fin structure has a U-shape. In other embodiments, the recessed fin structure has a V-shape showing (111) facets of silicon crystal. In other embodiments, the recess has a reverse trapezoid shape, or a rectangular shape.

In some embodiments, the recess is formed by a dry etching process, which may be anisotropic. The anisotropic etching process may be performed using a process gas mixture including $BF_2$, $Cl_2$, $CH_3F$, $CH_4$, HBr, $O_2$, Ar, other etchant gases. Process gases may be activated into a plasma by any suitable method of generating the plasma, such as transformer coupled plasma (TCP) systems, inductively coupled plasma (ICP) systems, magnetically enhanced reactive ion techniques. The plasma is a remote plasma that is generated in a separate plasma generation chamber connected to the processing chamber in some embodiments. The process gases used in the plasma etching process includes etchant gases such as $H_2$, Ar, other gases, or a combination of gases. In some embodiments, carrier gases, such as $N_2$, Ar, He, Xe, are combined with a plasma etching process gas using hydrogen (H) radicals. The H radicals may be formed by flowing $H_2$ gas into a plasma generation chamber and igniting a plasma within the plasma generation chamber. In some embodiments, an additional gas may be ignited into a plasma within the plasma generation chamber, such as Ar. The H radicals may selectively etch (100) planes over (111) planes or (110) planes. In some cases, the etch rate of the (100) planes is about three times greater than the etch rate of (111) planes. Due to this selectivity, the etching by the H radicals may tend to slow or stop along (111) planes or (110) planes of silicon during the second patterning process.

Figure 7:
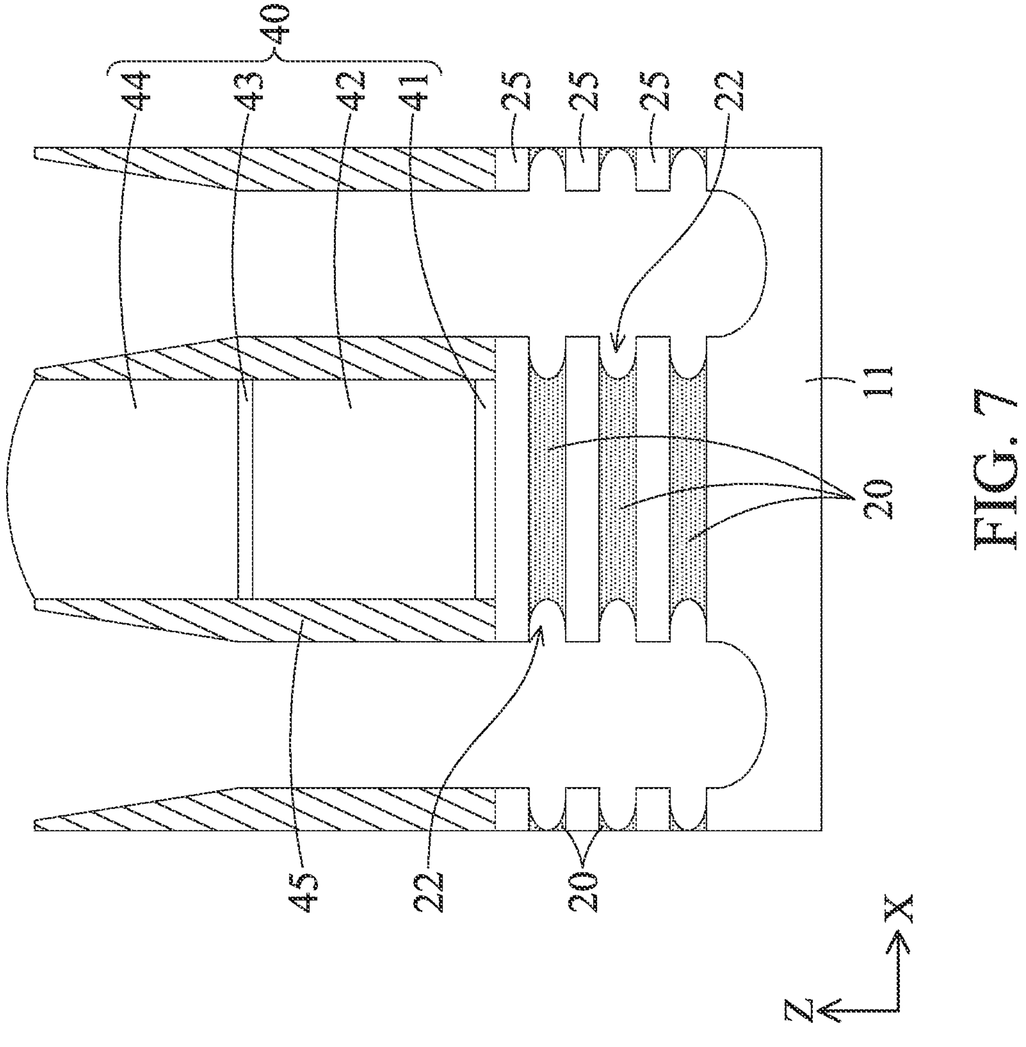
FIG. 7 shows a cross sectional view of one of the various stages of manufacturing a GAA FET semiconductor device according to an embodiment of the present disclosure.

Further, as shown in FIG. 7, the first semiconductor layers 20 are laterally etched in the X direction within the source/drain space 21, thereby forming cavities 22. When the first semiconductor layers 20 are SiGe and the second semiconductor layers 25 are Si, the first semiconductor layers 20 can be selectively etched by using a wet etchant such as, but not limited to, a mixed solution of $H_2O_2$, $CH_3COOH$ and HF, followed by $H_2O$ cleaning. In some embodiments, the etching by the mixed solution and cleaning by water is repeated 10 to 20 times. The etching time by the mixed solution is in a range from about 1 min to about 2 min in some embodiments. The mixed solution is used at a temperature in a range from about 60° C. to about 90° C. in some embodiments. In some embodiments, other etchants are used.

In some embodiments, the cavity 22 has a curved end shape convex toward the first semiconductor layer 20 (lateral U-shape cross section). In other embodiments, the cavity 22 has a lateral V-shape cross section having an apex at the first semiconductor layer 20.

Figure 8:
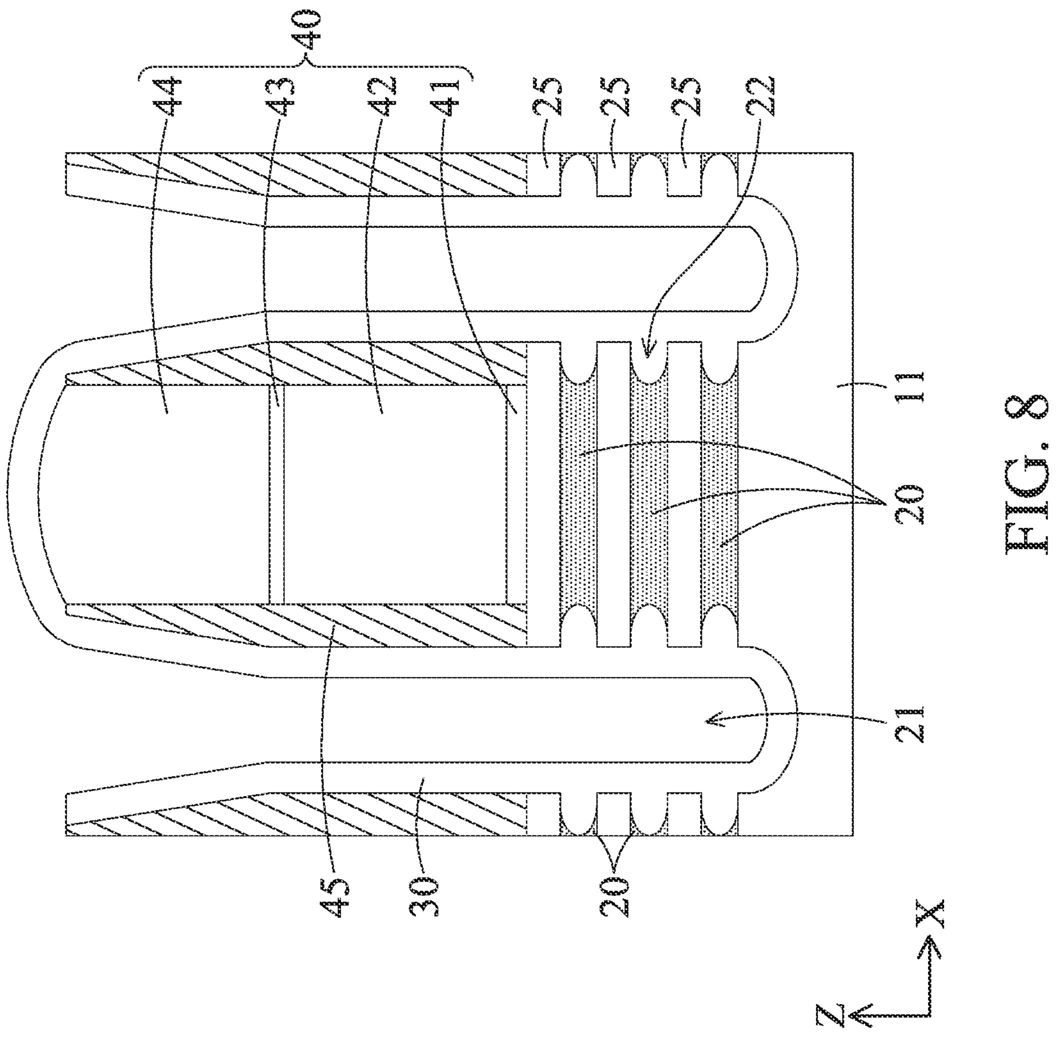
FIG. 8 shows a cross sectional view of one of the various stages of manufacturing a GAA FET semiconductor device according to an embodiment of the present disclosure.

Next, as shown in FIG. 8, a first insulating layer 30 is formed on the etched lateral ends of the first semiconductor layers 20 and on end faces of the second semiconductor layers 25 in the source/drain space 21 and over the sacrificial gate structure 40. The first insulating layer 30 is conformally formed so that a space is left in the source/drain space 21. The first insulating layer 30 includes one of silicon nitride and silicon oxide, SiON, SiOC, SiCN and SiOCN, or any other suitable dielectric material. The first insulating layer 30 is made of a different material than the sidewall spacers (first cover layer) 45 in some embodiments, and is made of the same material as the sidewall spacers 45 in other embodiments. The first insulating layer 30 can be formed by ALD or any other suitable methods. By forming the first insulating layer 30, the cavities 22 are fully filled with the first insulating layer 30.

Figure 9:
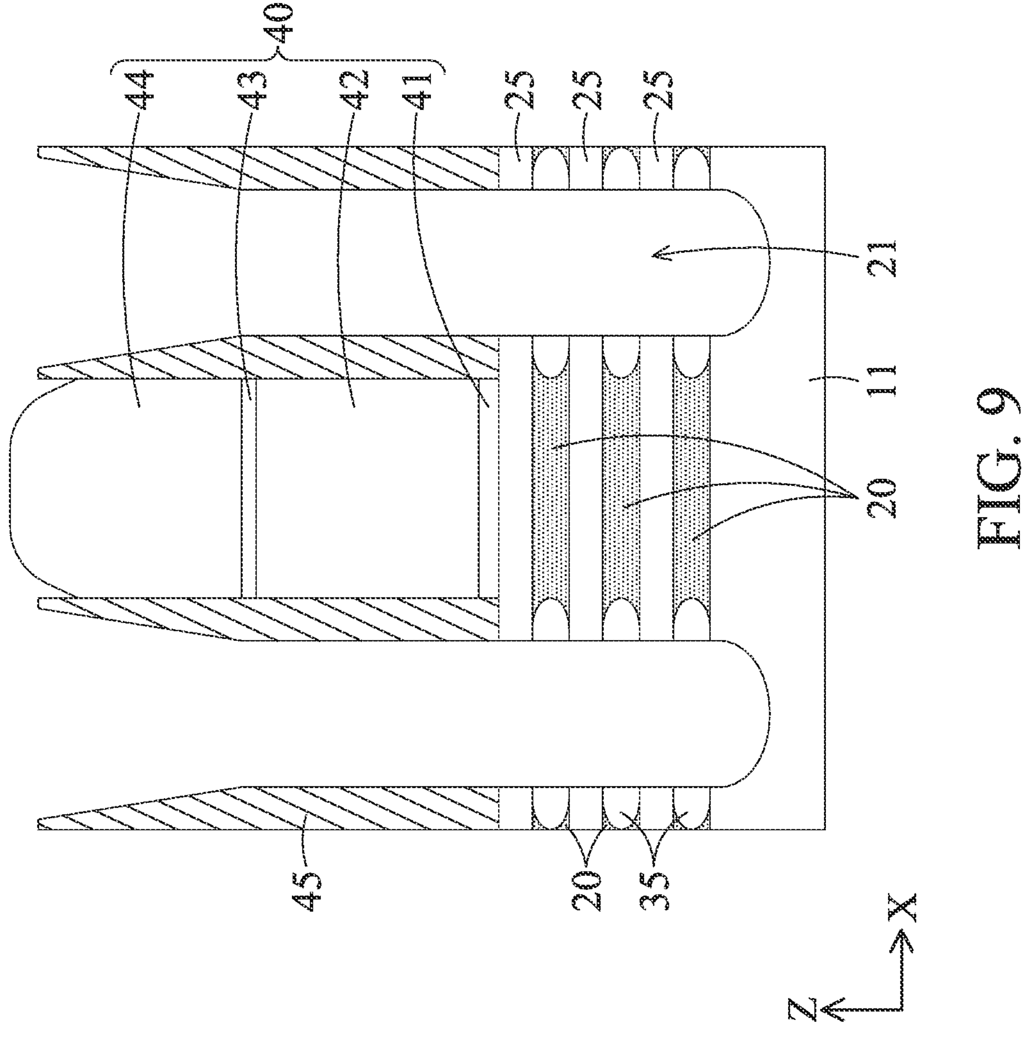
FIG. 9 shows a cross sectional view of one of the various stages of manufacturing a GAA FET semiconductor device according to an embodiment of the present disclosure.

After the first insulating layer 30 is formed, an etching operation is performed to partially remove the first insulating layer 30, thereby forming inner spacers 35, as shown in FIG. 9. In some embodiments, the end face of the inner spacers 35 is recessed more than the end face of the second semiconductor layers 25. The recessed amount is in a range from about 0.2 nm to about 3 nm and is in a range from about 0.5 nm to about 2 nm in other embodiments. In other embodiments, the recessed amount is less than 0.5 nm and may be equal to zero (i.e.—the end face of the inner spacer 35 and the end face of the second semiconductor layers 25 are flush with each other). In some embodiments, before forming the first insulating layer 30, an additional insulating layer having a smaller thickness than the first insulating layer 30 is formed, and thus the inner spacers 35 have a two-layer structure. In some embodiments, widths (lateral length) of the inner spacers 35 are not constant.

Figure 10:
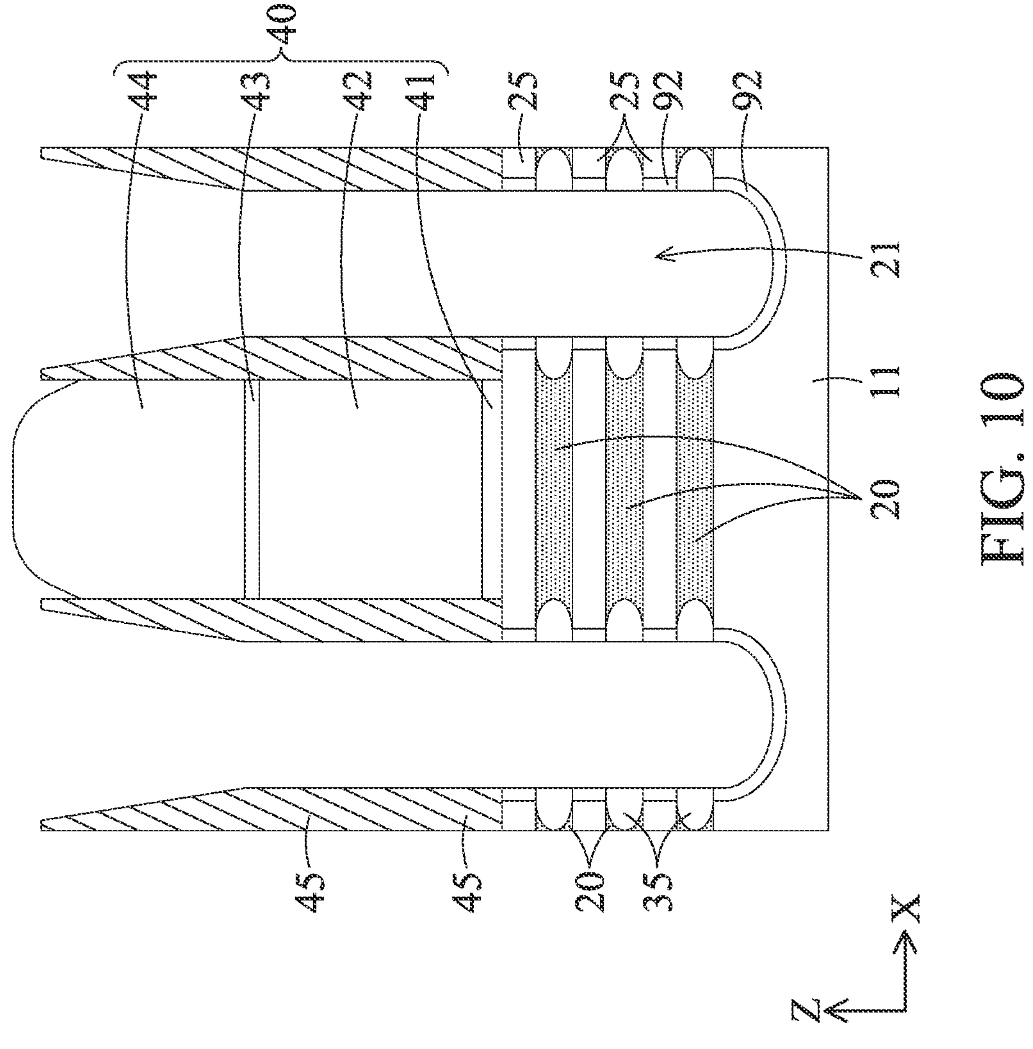
FIG. 10 shows a cross sectional view of one of the various stages of manufacturing a GAA FET semiconductor device according to an embodiment of the present disclosure.

After the inner spacers 35 are formed, a first epitaxial layer 92 is formed on lateral end faces of the second semiconductor layer 25 and the exposed surface of the lower fin structure 11 in some embodiments, as shown in FIG. 10. In some embodiments, the first epitaxial layer 92 includes Si doped with P or As for an n-type FET and doped with B for a p-type FET. In some embodiments, the dopant concentration of the first epitaxial layer 92 is higher than the dopant concentration of the second semiconductor layers 25. In some embodiments, the dopant concentration of the first epitaxial layer 92 gradually increases from the interface between the first epitaxial layer 92 and the second semiconductor layers 25 or lower fin structure 11 to the source/drain space 21. In some embodiments, the thickness of the first epitaxial layer 92 as deposited is in a range from about 1 nm to about 10 nm. In some embodiments, during the epitaxial formation of the first epitaxial layer 92, some of the dopant elements diffuse into the second semiconductor layer 25 or lower fin structure 11 to a depth of about 0.5 nm to about 2 nm.

Figure 11A:
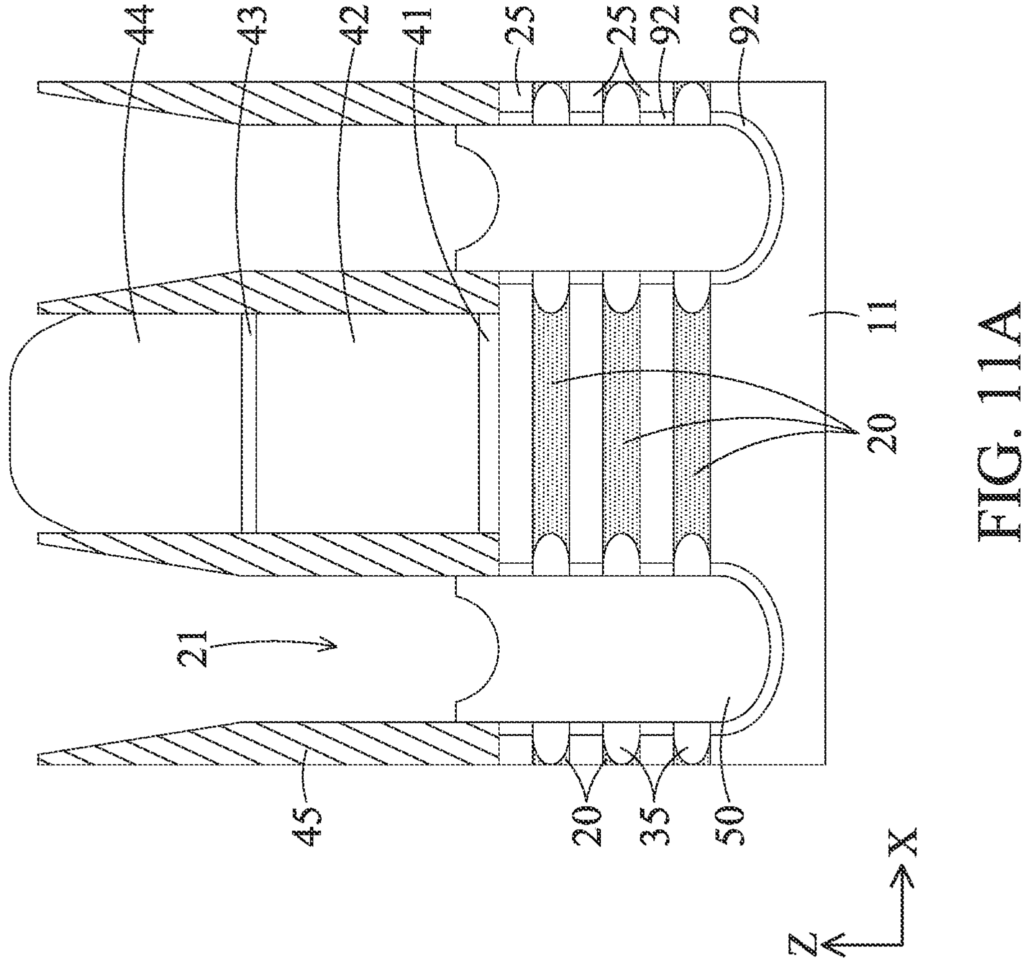
FIG. 11A shows a cross sectional view and FIG. 11B shows an isometric view of one of the various stages of manufacturing a GAA FET semiconductor device according to embodiments of the present disclosure.
Figure 11B:
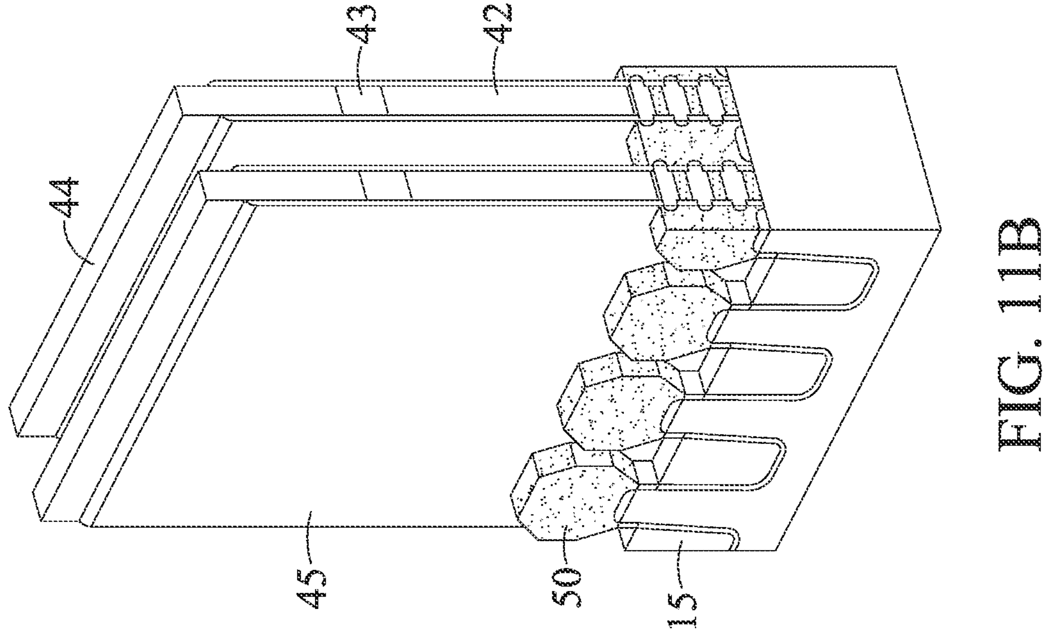

Then, as shown in FIGS. 11A and 11B, source/drain structures 50 are formed in the source/drain space 21. FIG. 11A is a cross section view along the X direction and FIG. 11B is an isometric view of the structure. In some embodiments, source/drain structures 50 include one or more layers of SiC, SiP, SiAs and/or SiCP for an n-type FET. In certain embodiments, SiC or SiCP is used. In some embodiments, the source/drain structure 50 includes SiGe, SiGeSn, Ge, GeSn and/or SiSn for a p-type FET. When SiGe is used, the Ge content is about 60 atomic % to about 80 atomic % in some embodiments. In some embodiments, the source/drain structures 50 are formed by an epitaxial process. In some embodiments, the source/drain structure 50 applies a tensile stress to the second semiconductor layer 25 for an n-type FET and a compressive stress to a p-type FET.

Figure 12:
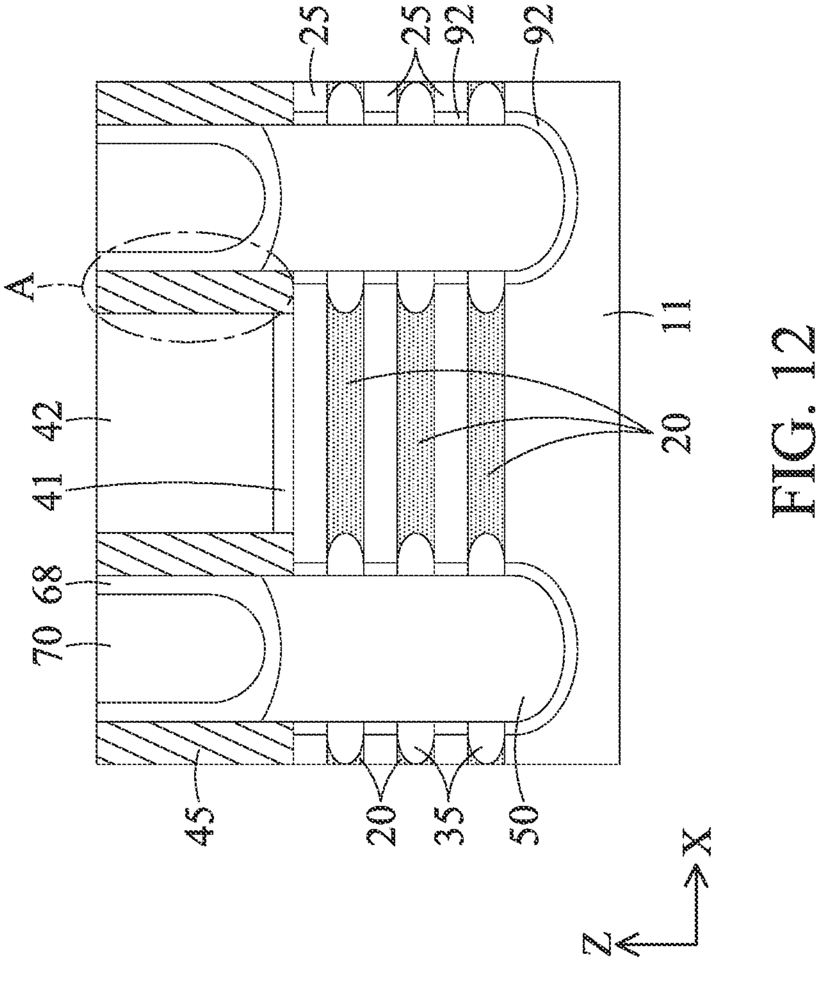
FIG. 12 shows a cross sectional view of one of the various stages of manufacturing a GAA FET semiconductor device according to an embodiment of the present disclosure.

Then, an interlayer dielectric (ILD) layer 70 is formed over the source/drain structure 50 and the sacrificial gate structure 40. In some embodiments, before the ILD layer 70 is formed, a contact etch stop layer 68 is formed. Next, the dielectric layer 70 is planarized by chemical mechanical polishing (CMP) to expose the sacrificial gate electrode layer 42, as shown in FIG. 12. The materials for the ILD layer 70 include compounds comprising Si, O, C, and/or H, such as a silicon oxide, SiCOH and SiOC. Organic materials, such as a polymer, including polyimide, may be used for the ILD layer 70. Materials for the contact etch stop layer 68 include a silicon nitride, a silicon oxide, SiCN, SiON, and SiOCN. The materials for the ILD layer 70 and the etch stop layer 68 are different from each other, and thus have different etch selectivities.

Figure 13:
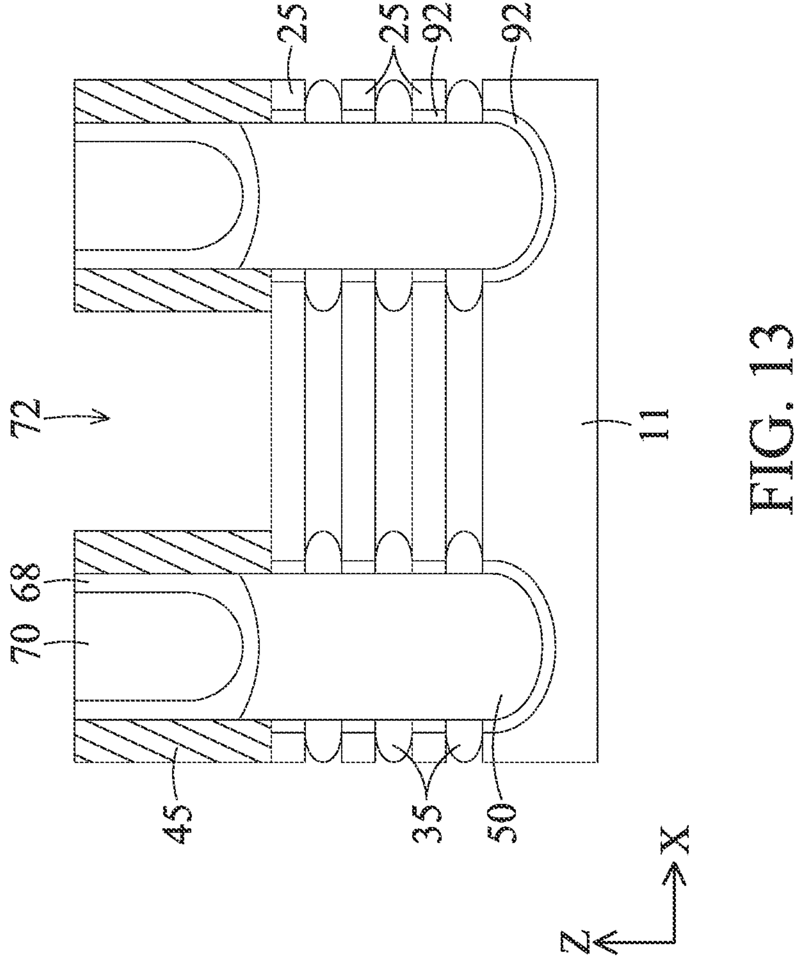
FIG. 13 shows a cross sectional view of one of the various stages of manufacturing a GAA FET semiconductor device according to an embodiment of the present disclosure.

Then, as shown in FIG. 13, the sacrificial gate electrode layer 42 and the sacrificial gate dielectric layer 41 are removed forming a gate space 72. The ILD layer 70 protects the source/drain structures 50 during the removal of the sacrificial gate structures. The sacrificial gate structures can be removed using plasma dry etching and/or wet etching. When the sacrificial gate electrode layer 42 is polysilicon and the dielectric layer 70 is silicon oxide, a wet etchant such as a TMAH solution can be used to selectively remove the sacrificial gate electrode layer 42. The sacrificial gate dielectric layer 41 is thereafter removed using plasma dry etching and/or wet etching.

After the sacrificial gate structures are removed, the first semiconductor layers 20 are removed, thereby forming nanowires or nanosheets (channel regions) of the second semiconductor layers 25 as shown in FIG. 13. The first semiconductor layers 20 can be removed or etched using an etchant that can selectively etch the first semiconductor layers 20 against the second semiconductor layers 25, as set forth above. Since the inner spacers 35 were previously formed, the etching of the first semiconductor layers 20 stops at the inner spacers 35. In other words, the inner spacers 35 function as an etch-stop layer for etching of the first semiconductor layers 20.

Figure 14A:
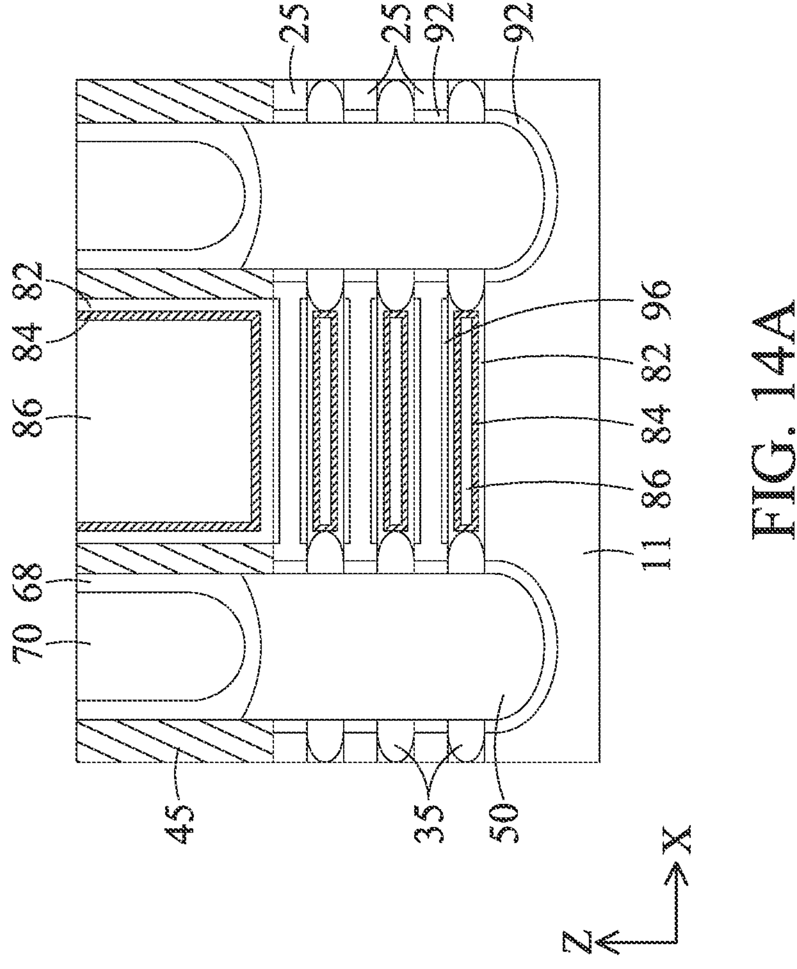
FIG. 14A shows a cross sectional view and FIG. 14B shows an isometric view of one of the various stages of manufacturing a GAA FET semiconductor device according to embodiments of the present disclosure.
Figure 14B:
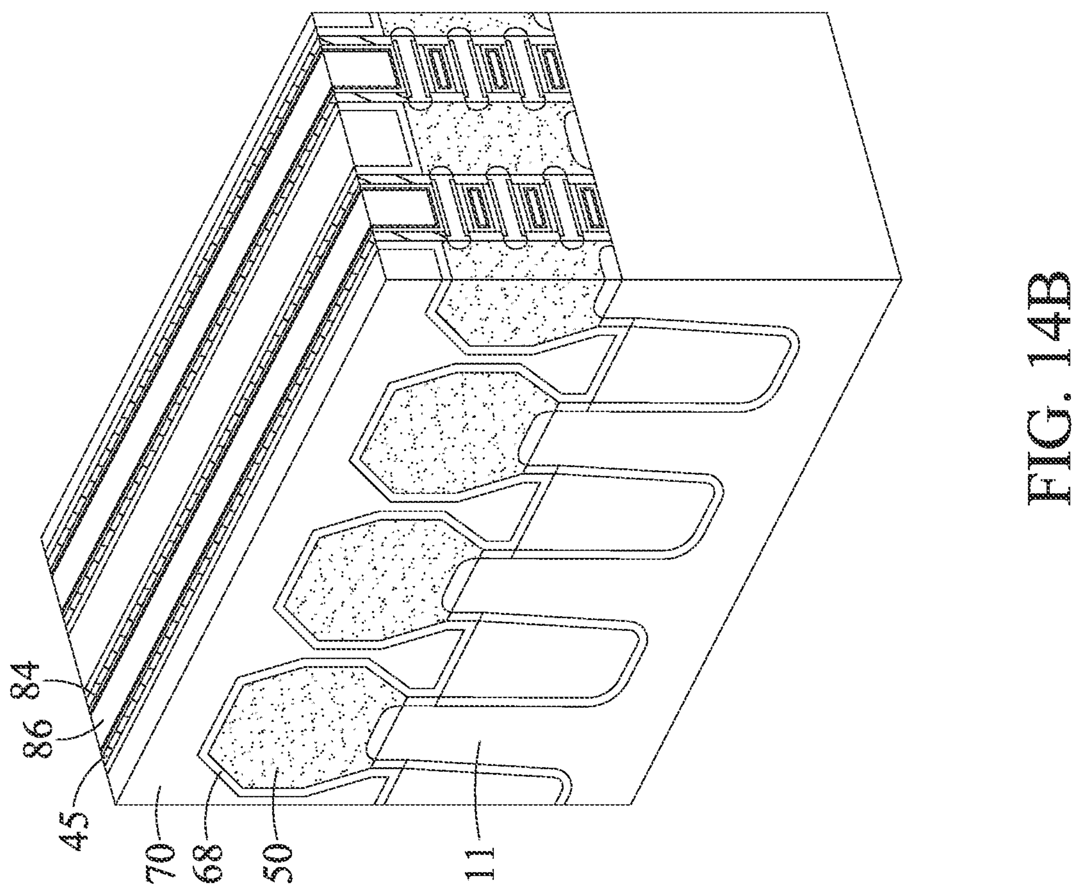

After the semiconductor nanowires or nanosheets (channel regions) of the second semiconductor layers 25 are formed, a metal gate structure is formed as shown in FIGS. 14A and 14B. FIG. 14A is a cross section view along the X direction and FIG. 14B is an isometric view. In some embodiments, the structure and/or material of the gate electrode for the n-type GAA FET are different from the structure and/or material of the gate electrode for the p-type GAA FET.

In certain embodiments, the gate dielectric layer 82 includes one or more layers of a dielectric material, such as silicon oxide, silicon nitride, or high-k dielectric material, other suitable dielectric material, and/or combinations thereof. High-k dielectric materials have a dielectric constant greater than that of silicon dioxide or greater than about 3.9. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 82 includes an interfacial layer 96 formed between the channel layers and the dielectric material.

The gate dielectric layer 82 may be formed by CVD, ALD or any suitable method. In one embodiment, the gate dielectric layer is formed using a highly conformal deposition process such as ALD in order to ensure the formation of a gate dielectric layer having a uniform thickness around each channel layer. The thickness of the gate dielectric layer 82 is in a range from about 1 nm to about 6 nm in one embodiment.

In some embodiments, the metal gate structure includes one or more work function adjustment layers 84 disposed over the gate dielectric layer 82. The work function adjustment layers 84 are made of a conductive material such as a single layer of TiN, TaN, TaAlC, TiC, TaC, Co, Al, TiAl, HfTi, TiSi, TaSi or TiAlC, or a multilayer of two or more of these materials. In some embodiments, one or more of TiAlC, Al, TiAl, TaN, TaAlC, TiN, TiC and Co are used as the work function adjustment layer for the p-channel FET. For an n-channel FET, one or more of TaN, TaAlC, TiN, TiC, Co, TiAl, HfTi, TiSi and TaSi is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

The gate electrode layer 86 is formed on the work function adjustment layer 84 to surround each channel layer. The gate electrode layer 86 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 86 may be formed by CVD, ALD, electro-plating, or other suitable method. The gate electrode layer is also deposited over the upper surface of the ILD layer 70. The gate dielectric layer, work function adjustment layer, and the gate electrode layer formed over the ILD layer 70 are then planarized by using, for example, CMP, until the top surface of the ILD layer 70 is revealed. In some embodiments, after the planarization operation, the gate electrode layer is recessed and a cap insulating layer (not shown) is formed over the recessed gate electrode. The cap insulating layer includes one or more layers of a silicon nitride-based material, such as silicon nitride. The cap insulating layer is formed by depositing an insulating material followed by a planarization operation.

Figure 15A:
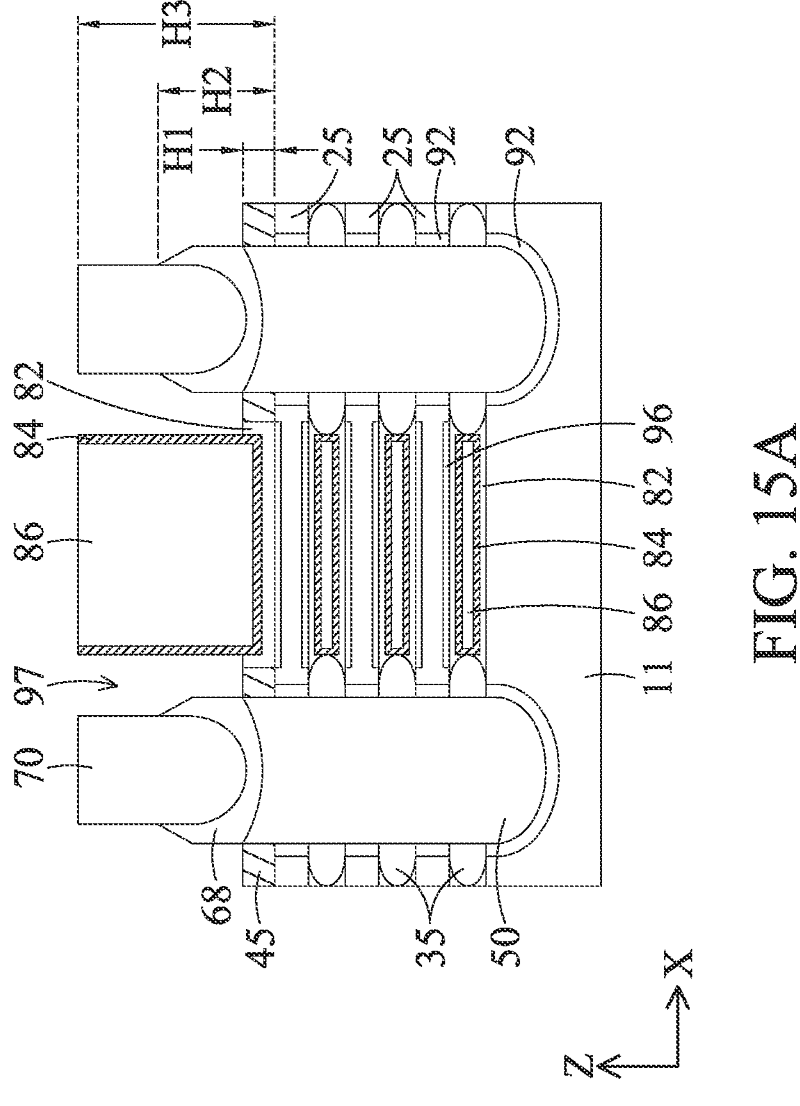
FIGS. 15A and 15B show cross sectional views and FIG. 15C shows an isometric view of one of the various stages of manufacturing a GAA FET semiconductor device according to embodiments of the present disclosure.
Figure 15B:
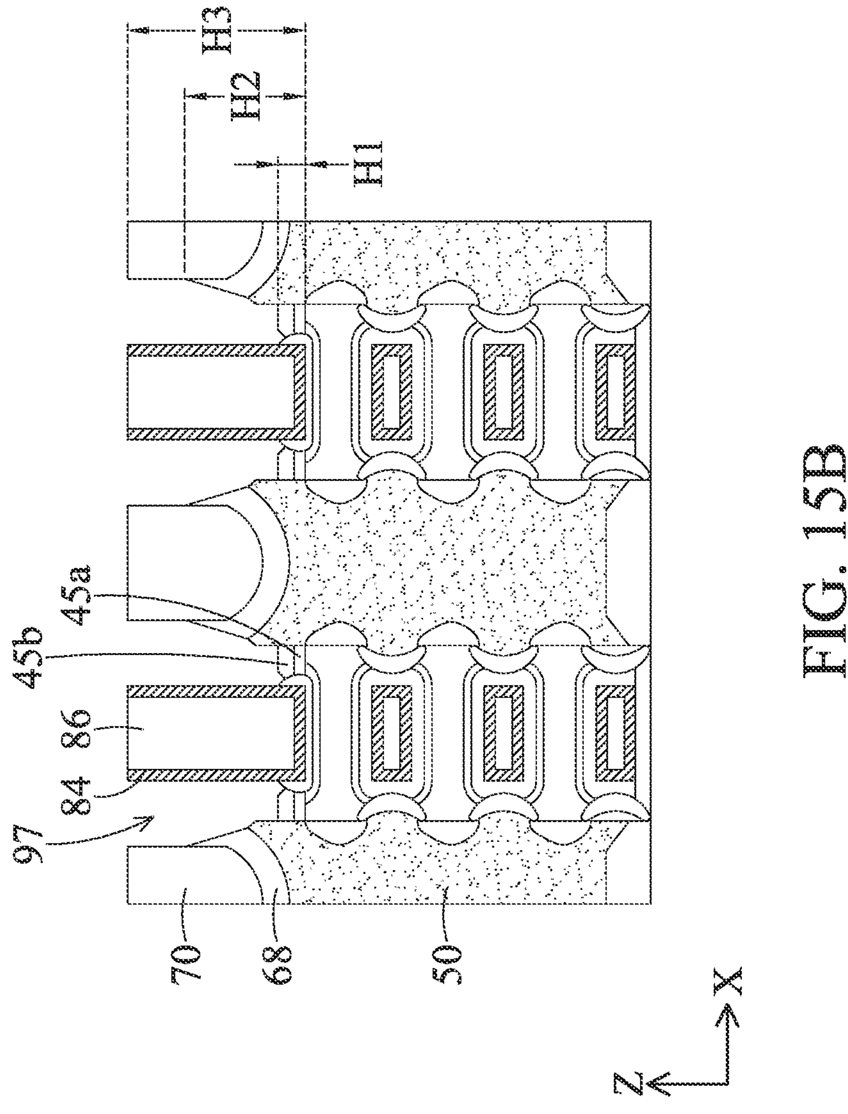
Figure 15C:
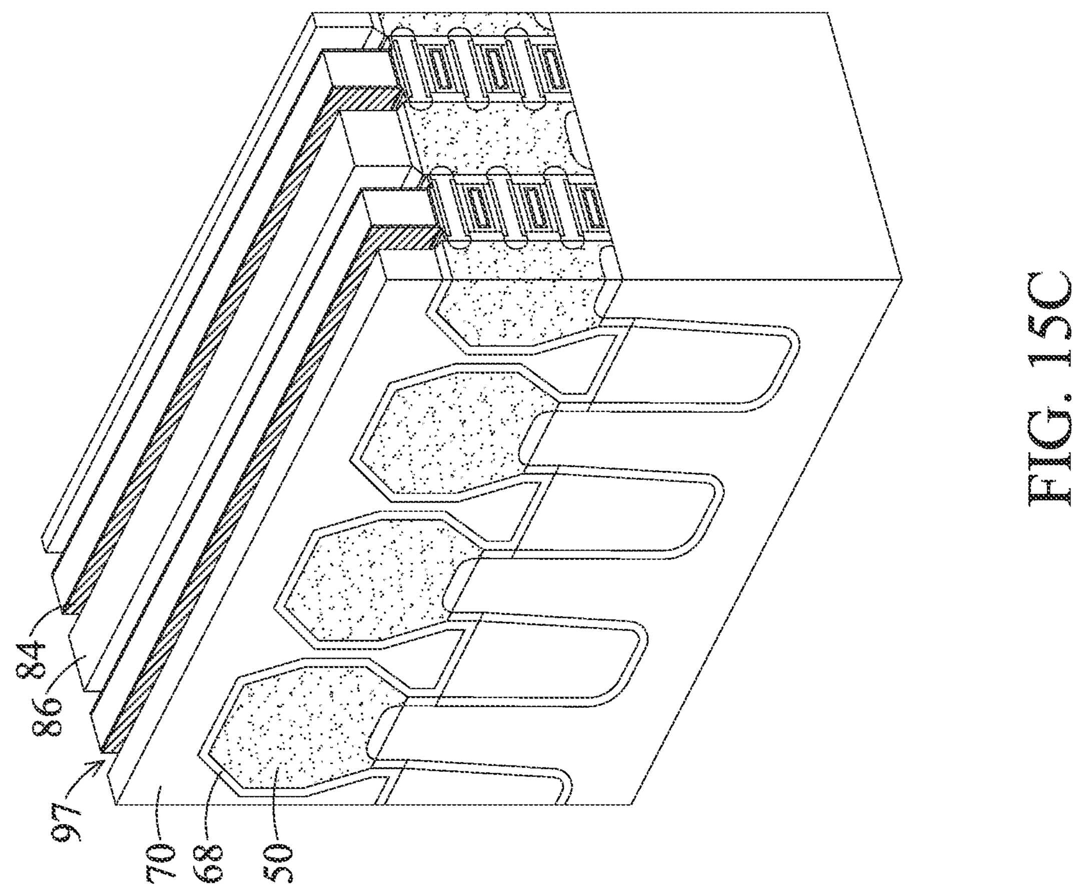

Then, the gate sidewall spacers 45 and the gate dielectric layer 82 on the sidewalls of the uppermost gate electrode layer 86 are removed, as shown in FIGS. 15A, 15B, and 15C. FIG. 15A is a cross section view along the X axis. FIG. 15B is a cross section view along the X axis of another structural embodiment formed with two gate sidewall spacer layers 45*a*, 45*b*, and FIG. 15C is an isometric view. Formation of the embodiment with two gate sidewall spacer layers is explained below.

The gate sidewall spacers 45 and the gate dielectric layer 82 are removed using one or more photolithography and etching operations. In some embodiments the contact etch stop layer 68 adjacent the ILD layer 70 is etched back during the gate sidewall spacer and gate dielectric layer removal operations. A space 97 is formed between the uppermost gate electrode layer 86 and the ILD layer 70. As shown in FIG. 15C, the spaces 97 are trenches in some embodiments. In some embodiments, after the gate sidewall spacer and gate dielectric layer removal operation, the gate dielectric layer 82 and the gate sidewall spacer 45 extend a height H1 of about 1 nm to about 20 nm above an uppermost semiconductor nanostructure 25 along the Z direction. In other embodiments the gate dielectric 82 and the gate sidewall spacer extend about 1 nm to about 10 nm above the uppermost semiconductor nanostructure 25 along the Z direction, and extend about 3 nm to about 8 nm above the uppermost nanostructure 25 in yet other embodiments. In some embodiments, the contact etch stop layer 68 is etched down to less than half the height of the ILD layer in the Z direction. In some embodiments the contact etch stop layer 68 extends to a height H2 of about 0 nm to about 40 nm above the uppermost nanostructure 25. In other embodiments, the contact etch stop layer 68 extends about 2 nm to about 20 nm above the uppermost nanostructure 25.

Anisotropic etching is used to form the space or trench 97. The anisotropic etching produces a space 97 that is wider at the top and narrower at the bottom, as shown in FIGS. 15A and 15B. The upper portion of the contact etch stop layer 68 is removed during the anisotropic etching operation in some embodiments.

In some embodiments, the gate electrode 86 extends a height H3 of about 40 nm to about 200 nm above the uppermost second semiconductor layer 25 in the Z direction. In some embodiments, the gate electrode 86 extends a height of about 60 nm to about 150 nm above the uppermost second semiconductor layer 25. In some embodiments, a ratio of the height H3 of gate electrode 86 to the height H1 of the uppermost gate dielectric layer 82 or gate sidewall spacer 45, H3/H1, ranges from about 200:1 to about 2:1, and in other embodiments H3/H1 ranges from about 20:1 to about 10:1. In some embodiments, a ratio of the height H2 of the contact etch stop layer to the height of the height H1 of the uppermost gate dielectric layer 82 or gate sidewall spacer, H2/H1, ranges from about 40:1 to about 1:1, and in other embodiments H2/H1 ranges from about 20:1 to about 2:1. In some embodiments, the uppermost gate dielectric layer 82 or gate sidewall spacer 45 extends about 0.5% to about 50% the height H1 of the gate electrode 86 along the gate electrode 86 opposing sidewalls above the uppermost second semiconductor layer 25 in the Z direction (about 0.005H1 to about 0.5H1). In other embodiments, the uppermost gate dielectric layer 82 or gate sidewall spacer 45 extends about 1% to about 33% the height H1 of the gate electrode 86 along the gate electrode 86 opposing sidewalls above the uppermost second semiconductor layer 25 in the Z direction (about 0.01H1 to about 0.33H1).

Figure 16C:
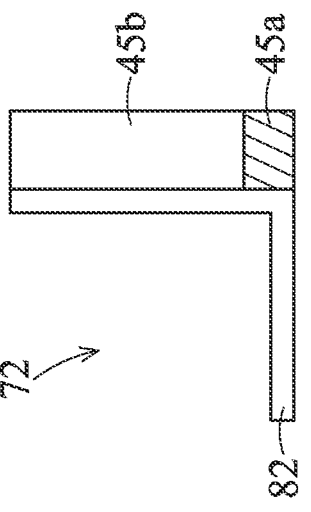
FIGS. 16A, 16B, 16C, 16D, 16E, and 16F show cross sectional views of the various stages of manufacturing a GAA FET semiconductor device according to embodiments of the present disclosure.

In some embodiments, a plurality of sidewall spacers 45*b*, including first gate sidewall spacers 45*a* and a second gate sidewall spacers are formed on sidewalls of the sacrificial gate electrode layer 42. FIG. 16A corresponds to a schematic view of detail A in FIG. 12, with a difference that gate sidewall spacer 45 includes a first sidewall spacer 45*a* and a second sidewall spacer 45*b*. The first and second sidewall spacers 45*a*, 45*b* include one or more of silicon nitride, silicon oxide, SiON, SiCN, SiCO, SiOCN or any other suitable dielectric material. In some embodiments, the first sidewall spacer 45*a* is conformally formed over the device structure, then the second sidewall spacer 45*b* is formed over the first sidewall spacer, and then the structure undergoes a planarization operation, such as CMP, to expose an upper surface of the sacrificial gate electrode layer 42. The sidewall spacers 45*a*, 45*b* can be formed by ALD or CVD, or any other suitable method. In some embodiments, the first sidewall spacer 45*a* and the second sidewall spacer 45*b* are formed of different materials. In some embodiments, the first sidewall spacer 45*a* is an oxide, such as silicon oxide, and the second sidewall spacer 45*b* is a nitride, such as silicon nitride. In other embodiments, the first sidewall spacer 45*a* is silicon nitride and the second sidewall spacer 45*b* is silicon oxide.

Figure 16B:
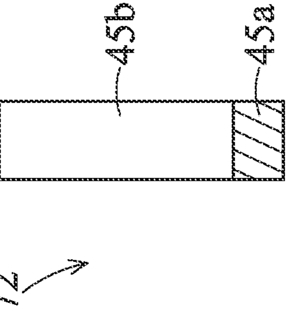
Figure 16A:
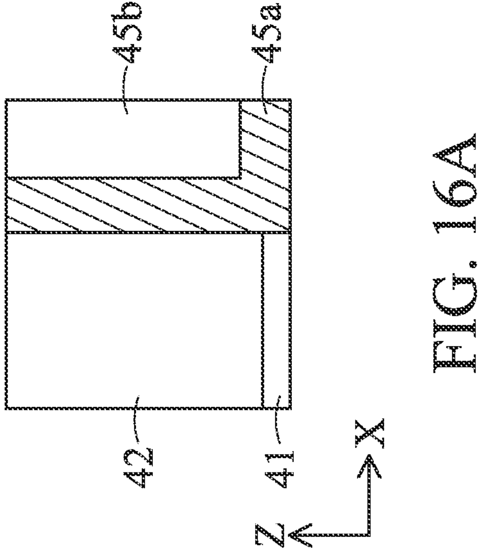

FIG. 16B corresponds to FIG. 13, where the sacrificial gate electrode layer 42 and sacrificial gate dielectric layer 41 are removed to form a gate space 72. In some embodiments, the first sidewall spacer 45*a* is removed during the operation of removing the sacrificial gate electrode layer and sacrificial gate dielectric layer. The sacrificial gate structures and the first sidewall spacer 45*a* can be removed using plasma dry etching and/or wet etching. In some embodiments, the second gate spacer 45*b* is masked during the sacrificial gate removal operation, and in other embodiments, etchants that are selective to the sacrificial gate structures 42, 41 and the first sidewall spacer 45*a* are used during the sacrificial gate removal and first sidewall spacer removal operations so that the second sidewall spacer 45*b* is substantially not etched. In some embodiments, the portion of the first sidewall spacer 45*a* underneath the second sidewall spacer 45*b* remains after the first sidewall spacer removal operation, as shown in FIG. 16B.

Figures 16D, 16E, 16F:
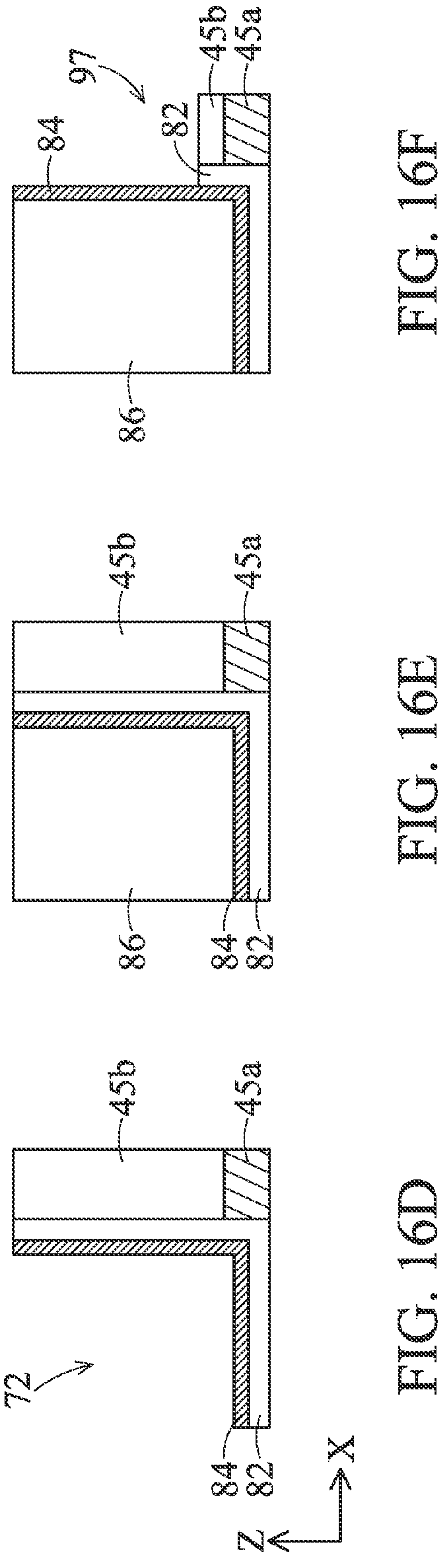

Next, as shown in FIG. 16C, the gate dielectric layer 82 is conformally formed in the gate space 72. The gate dielectric layer 82 may be made of any of the high-k gate dielectric materials disclosed herein with reference to FIGS. 14A and 14B. Then, in some embodiments, one or more work function adjustment layers 84 are disposed over the gate dielectric layer 82 in the gate space 72, as shown in FIG. 16D. The work function adjustment layers 84 are made of any of the work function adjustment layer materials disclosed herein and are formed by any of the work function adjustment layer formation techniques disclosed herein with reference to FIGS. 14A and 14B.

The gate electrode layer 86 is subsequently formed over the work function adjustment layer 84, as shown in FIG. 16E. The gate electrode layer 86 may be formed of any of the gate electrode layer materials disclosed herein and may be formed by any of the gate electrode layer forming operations disclosed herein with reference to FIGS. 14A and 14B. Planarization operations, such as CMP, may be performed after any of the gate dielectric layer formation, work function adjustment layer formation, or gate electrode layer formation operations.

As shown in FIG. 16F, the gate dielectric layer 82 and second sidewall spacers 45*b* are subsequently removed by suitable etching techniques as described herein with reference to FIGS. 15A-15C to form the space 97 between the gate electrode structure 84, 86 and the ILD layer 70 (not shown in FIG. 16F).

Figure 17C:
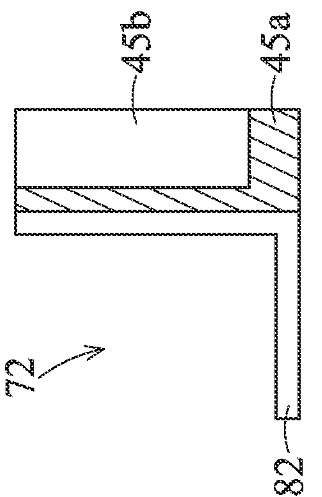
FIGS. 17A, 17B, 17C, 17D, 17E, and 17F show cross sectional views of the various stages of manufacturing a GAA FET semiconductor device according to embodiments of the present disclosure.
Figure 17B:
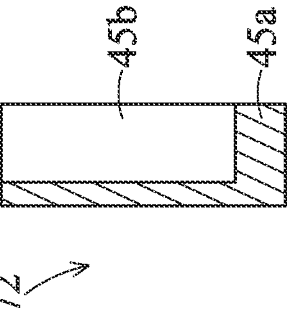
Figure 17A:
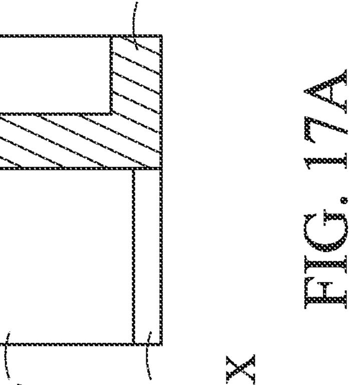

FIGS. 17A-17F illustrate an alternative embodiment of forming the disclosed semiconductor device having first and second sidewall spacers 45*a*, 45*b*. FIG. 17A corresponds to a schematic view of detail A in FIG. 12, with a difference that gate sidewall spacer 45 includes a first sidewall spacer 45*a* and a second sidewall spacer 45*b*. The first and second sidewall spacers 45*a*, 45*b* may be formed of the materials and by the techniques disclosed herein with reference to FIG. 16A.

FIG. 17B corresponds to FIG. 16B, except a vertical portion of the first sidewall spacer 45*a* remains after the first sidewall spacer removal operation. This can be achieved by masking the remaining portion of the first sidewall spacer 45*a* during the first sidewall spacer removal etching operation. Otherwise, the sacrificial gate electrode layer 42, sacrificial gate dielectric layer 41, and first sidewall spacer 45*a* are removed as disclosed herein with reference to FIG. 16B to form gate space 72.

Next, as shown in FIG. 17C, the gate dielectric layer 82 is conformally formed in the gate space 72 in the same manner as disclosed herein with reference to FIG. 16C. Then, in some embodiments, one or more work function adjustment layers 84 are disposed over the gate dielectric layer 82 in the gate space 72, as shown in FIG. 17D, in the same manner as disclosed herein with reference to FIG. 16D.

Figures 17D, 17E, 17F:
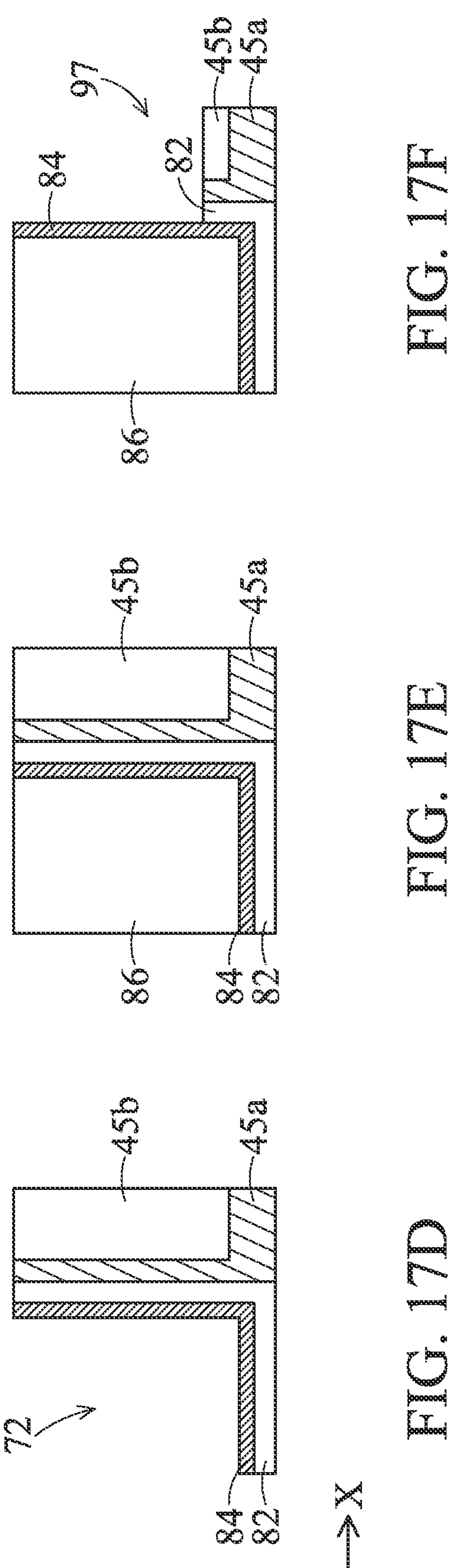

The gate electrode layer 86 is subsequently formed over the work function adjustment layer 84, as shown in FIG. 17E, in the same manner as disclosed herein with reference to FIG. 16E. Then, as shown in FIG. 17F, the gate dielectric layer 82, the remaining portion of the first sidewall spacer 45*a*, and second sidewall spacers 45*b* are subsequently removed by suitable etching techniques in a similar manner as described herein with reference to FIGS. 15-15C and 17F to form the space 97 between the gate electrode structure 84, 86 and the ILD layer 70 (not shown in FIG. 17F).

Figure 18:
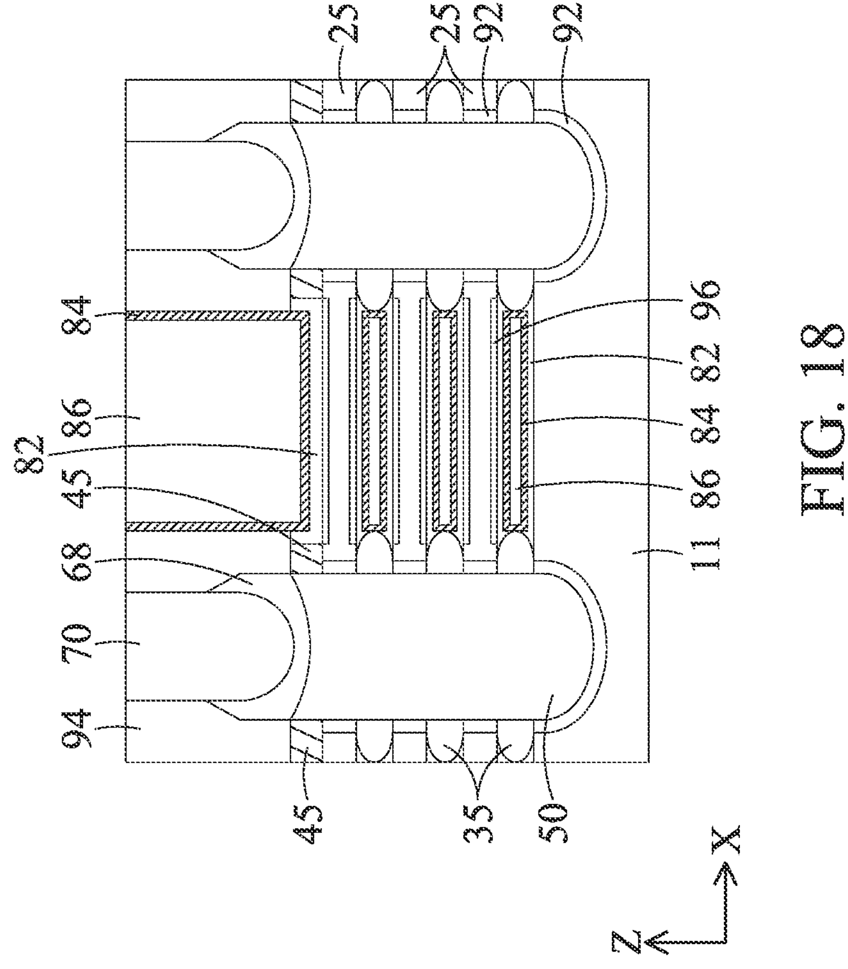
FIG. 18 shows a cross sectional view of one of the various stages of manufacturing a GAA FET semiconductor device according to an embodiment of the present disclosure.

A refill insulating layer 94 is formed in the space 97 between the uppermost portion of the gate electrode structure 84, 86 and the ILD layer 70. The refill insulating layer 94 includes one or more layers of insulating material, such as a silicon oxide, a silicon nitride, SiCN, SiON, SiOCN, or any other suitable insulating materials. The refill insulating layer 94 is formed by CVD, LPCVD, PECVD, ALD, or any suitable deposition operation. Then, a planarization operation, such as CMP and/or an etch-back method, is performed such that the upper surface of the ILD layer 70 is exposed from the refill insulating layer 94, as shown in FIG. 18. The refill insulating layer 94 is formed of a different material than the ILD layer 70 and the contact etch stop layer 68 in some embodiments.

Figure 19:
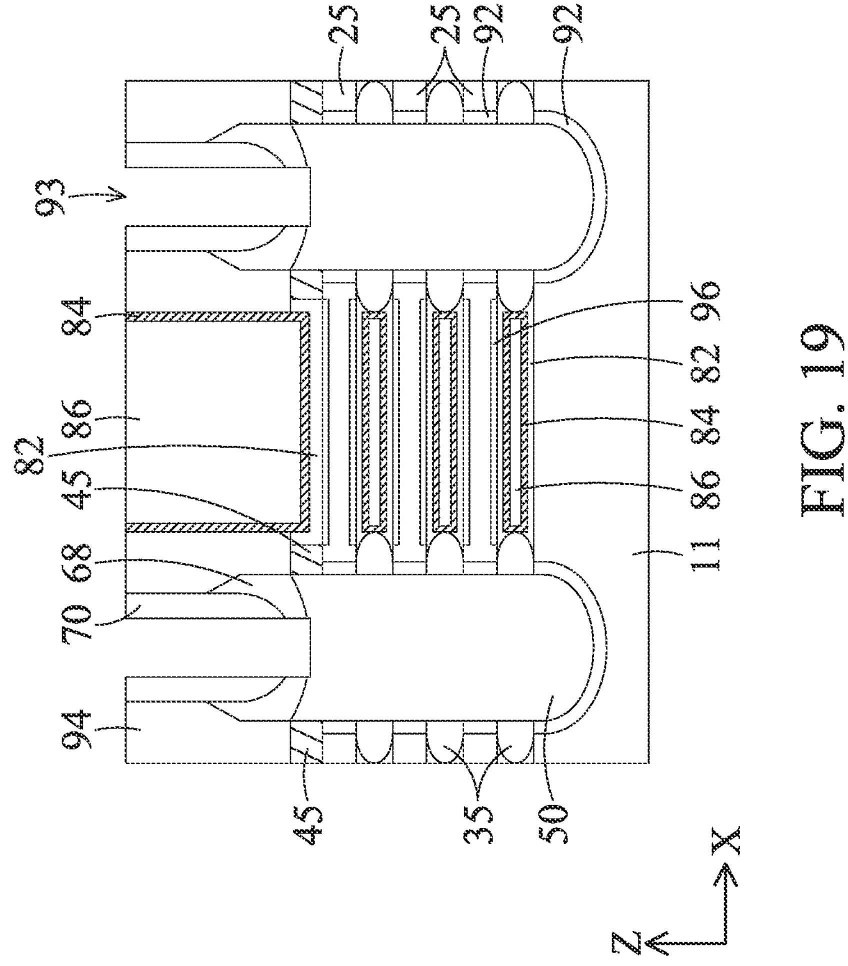
FIG. 19 shows a cross sectional view of one of the various stages of manufacturing a GAA FET semiconductor device according to an embodiment of the present disclosure.

Then, openings 93 are formed in the ILD layer 70 by using one or more lithography and etching operations to expose an upper surface of the source/drain structures 50, as shown in FIG. 19.

Figure 20:
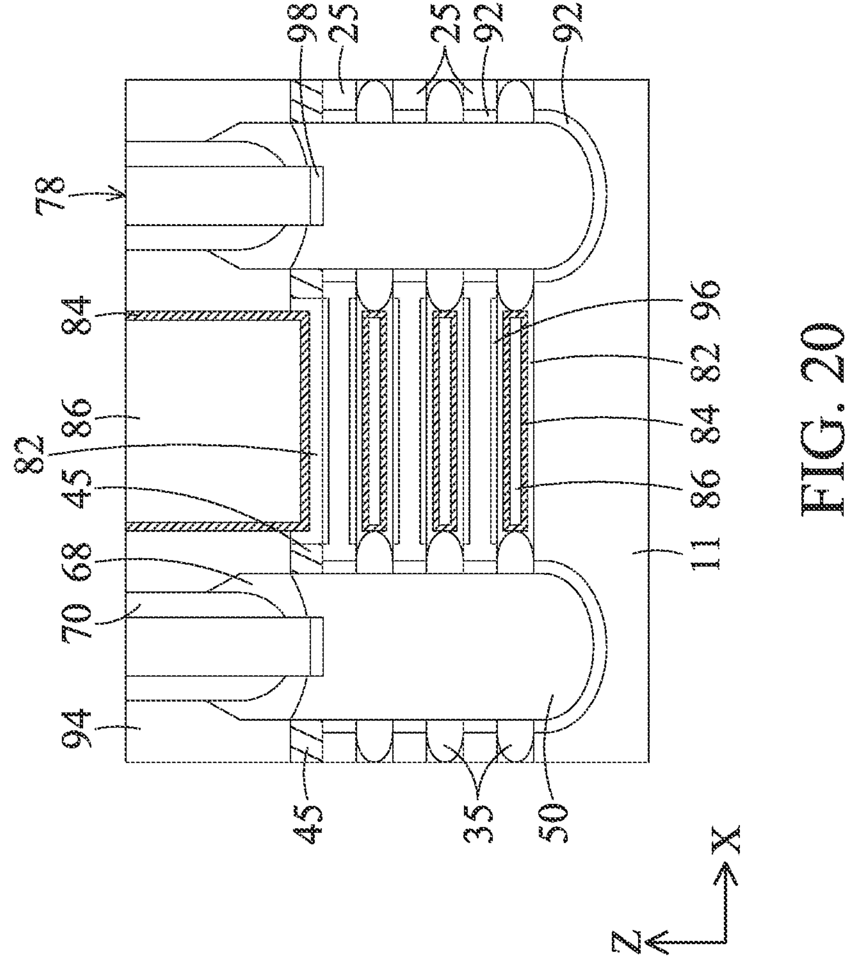
FIG. 20 shows a cross sectional view of one of the various stages of manufacturing a GAA FET semiconductor device according to an embodiment of the present disclosure.

A conductive contact 78 or source/drain contact is formed in the openings 93, as shown in FIG. 20, to form electrical contact with the source/drain structure. The conductive contact 78 includes one or more metal or metallic layers of Ti, TiN, Ta, TaN, Co, W, or an alloy thereof. In some embodiments, a silicide layer 98 is formed on source/drain structure 50 before the conductive contact 78 is formed. In some embodiments, the silicide layer 98 includes WSi, NiSi, TiSi or CoSi or other suitable silicide material or an alloy of a metal element and silicon and/or germanium. In some embodiments, a metal is deposited over the exposed surfaces of the second semiconductor layers 25 and the lower fin structures 11, and then the structure is heated to react the metal with the underlying material to form the metal silicide. The conductive contact 78 may be formed by CVD, ALD, electro-plating, or other suitable method. The conductive contact material is also deposited over the upper surface of the ILD layer 70, refill insulating layer 94, and gate electrode 86. The structure is then planarized by using, for example, CMP, until the top surface of the ILD layer 70 is revealed.

Figure 21:
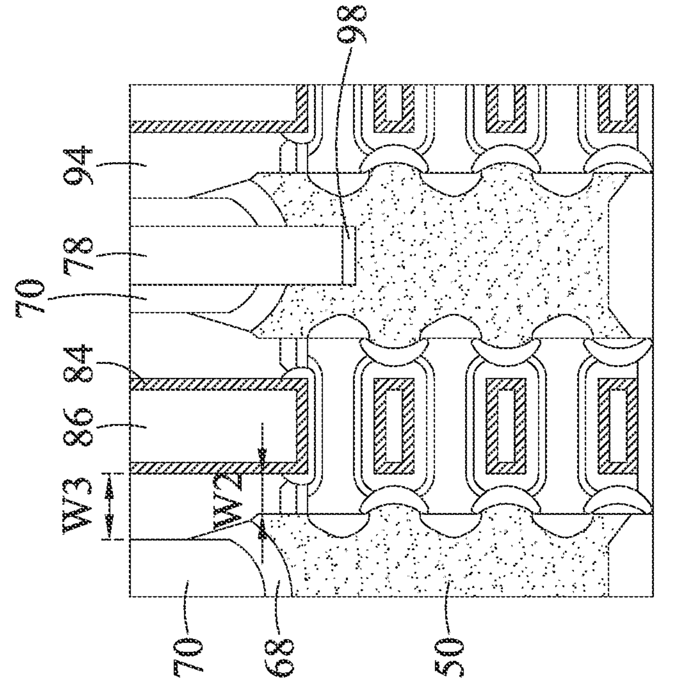
FIG. 21 shows a cross sectional view of one of the various stages of manufacturing a GAA FET semiconductor device according to an embodiment of the present disclosure.

FIG. 21 illustrates an embodiment of the disclosure where the contact etch stop layer 68 and ILD layer 70 have a bottom V-shape, and the width of the refill insulating layer 94 increases as the distance from the top surface of the gate sidewall spacers 45 and gate dielectric layer 82 increases. In some embodiments, the width of the refill insulating layer 94 between the gate electrode 86 and the contact etch stop layer 68 or ILD layer 70 ranges from about 3 nm to about 10 nm at the bottom refill insulating layer 94 (W2) (adjacent the gate sidewall spacer 45) to a range of from about 3 nm to about 15 nm at the top of the refill insulating layer 94 (W3).

Figure 22:
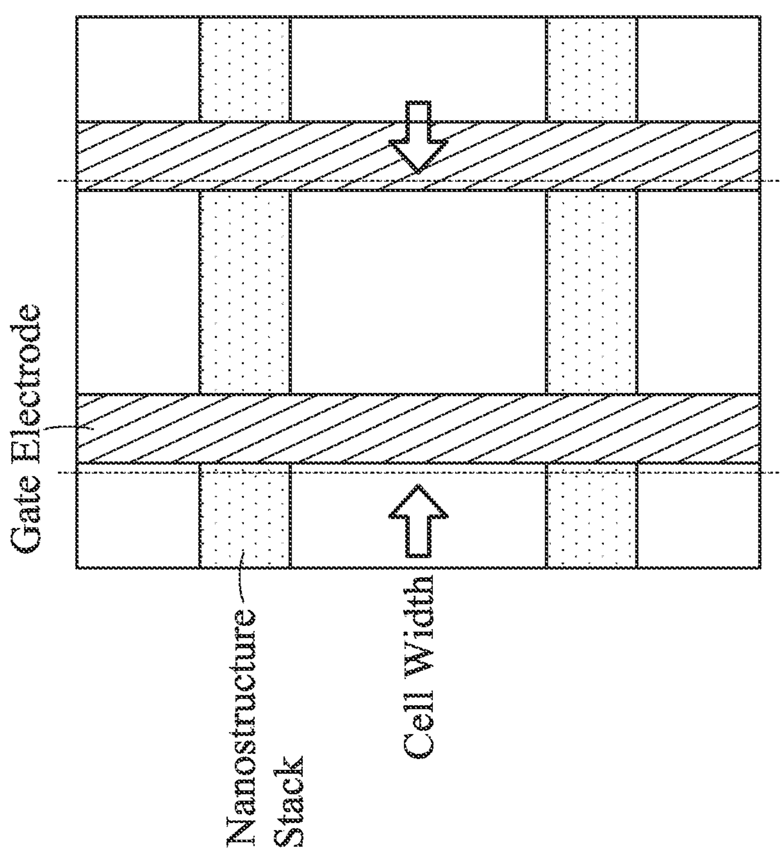
FIG. 22 shows a plan view of a GAA FET semiconductor device according to an embodiment of the present disclosure.

In embodiments of the present disclosure, a reduction of the cell width is obtained, as illustrated in plan view in FIG. 22. A cell width reduction of about 3 nm to about 10 nm is obtained by embodiments of the disclosure. For example, cell isolation architecture according to embodiments of the present disclosure provide a reduction in the cell width from about 50 nm to a cell width in a range from about 40 nm to about 47 nm. By removing the gate sidewall spacers and gate dielectric layer from the sidewalls of the uppermost gate electrode, the width of the isolation layer surrounding the source/drain conductive contact can be increased. In embodiments of the disclosure, the GAA FET contact isolation architecture reduces time-dependent dielectric breakdown (TDDB) and increases the performance of the GAA FET. Embodiments of the disclosure provide a thicker isolation layer surrounding the source/drain contacts, and allow the GAA FET to operate at lower power, thereby generating less heat. In some embodiments, electrical conductivity of the device is increased by about 3% to about 10%.

It will be understood that not all advantages have been necessarily discussed herein, no particular advantage is required for all embodiments or examples, and other embodiments or examples may offer different advantages.

According to an embodiment of the disclosure a method of manufacturing a semiconductor device includes forming a gate electrode structure over a channel region, wherein the gate electrode structure includes a gate dielectric layer disposed over the channel region, a gate electrode disposed over the gate dielectric layer, and insulating spacers disposed over opposing sidewalls of the gate electrode, wherein the gate dielectric layer is disposed over opposing sidewalls of the gate electrode. An interlayer dielectric layer is formed over opposing sidewalls of the insulating spacers. The insulating spacers are removed from an upper portion of the opposing sidewalls of the gate electrode to form trenches between the opposing sidewalls of the upper portion of the gate electrode and the interlayer dielectric layer; and the trenches are filled with an insulating material. In an embodiment, the insulating material includes a different material than the insulating spacers. In an embodiment, the insulating material includes one or more selected from the group consisting of a silicon nitride, a silicon oxide, SiCN, SiON, and SiOCN. In an embodiment, the forming the gate electrode structure includes: forming a sacrificial gate electrode over the channel region; forming the insulating spacers on sidewalls of the sacrificial gate electrode; forming source/drain structures over opposing sides of the sacrificial gate electrode outside the insulating spacers; removing the sacrificial gate electrode to form a gate space; partially removing the insulating spacers; and forming the gate dielectric layer and the gate electrode in the gate space after partially removing the insulating spacers. In an embodiment, the insulating spacers include first insulating spacers formed along the sidewalls of the sacrificial gate electrode and second insulating spacers formed on the first insulating spacers, and the partially removing the insulating spacers includes removing the first insulating spacers. In an embodiment, the method includes removing a portion of the gate dielectric layer along the opposing sidewalls of the gate electrode. In an embodiment, the removing the insulating spacers is performed by anisotropic etching.

According to another embodiment of the disclosure, a method of manufacturing a semiconductor device includes forming a stacked structure of first semiconductor layers and second semiconductor layers alternately stacked in a first direction over a substrate. The stacked structure is patterned into a fin structure extending along a second direction substantially perpendicular to the first direction. A sacrificial gate structure is formed extending in a third direction over a first portion of the first semiconductor layers and second semiconductor layers, the third direction being substantially perpendicular to both the first direction and the second direction. The sacrificial gate structure includes a sacrificial gate dielectric layer, a sacrificial gate electrode layer formed over the sacrificial gate dielectric layer, and insulating sidewall spacers formed over opposing sidewalls of the sacrificial gate electrode layer. An interlayer dielectric layer is formed over the insulating sidewall spacers. The sacrificial gate electrode layer, the sacrificial gate dielectric layer, and a portion of the first semiconductor layers between adjacent second semiconductor layers is removed. A gate structure is formed extending in the third direction over the first portion of the second semiconductor layers so that the gate structure wraps around the second semiconductor layers. The gate structure includes a gate dielectric layer and a gate electrode layer formed over the gate dielectric layer, and the gate dielectric layer extends along opposing sidewalls of the gate electrode layer. The insulating sidewall spacers are removed from an upper portion of the opposing sidewalls of the gate electrode to form trenches on opposing sides of the gate electrode layer, and the trenches are filled with an insulating material. In an embodiment, the method includes performing a planarizing operation after filling the trenches with the insulating material. In an embodiment, the insulating material comprises a different material than the insulating sidewall spacers and the interlayer dielectric layer. In an embodiment, the insulating sidewall spacers include first insulating sidewall spacers and second insulating sidewall spacers, the first insulating sidewall spacers are formed along the opposing sidewalls of the sacrificial gate electrode layer, the second insulating sidewall spacers are formed on the first insulating sidewall spacer, and a portion of the first insulating sidewall spacers is removed before the forming a gate structure. In an embodiment, the removing the insulating sidewall spacers includes removing the first insulating sidewall spacers and the second insulating sidewall spacers. In an embodiment, the method includes forming source/drain structures on opposing sides of the sacrificial gate structure; and forming an etch stop layer over the source/drain structures and the insulating sidewall spacers before forming the interlayer dielectric layer. In an embodiment, the method includes removing the gate dielectric layer from the upper portion of the opposing sidewalls of the gate electrode layer during the removing the insulating sidewall spacers from an upper portion of the opposing sidewalls of the gate electrode layer. In an embodiment, the gate dielectric layer and the insulating sidewall spacers are removed from the upper portion of the opposing sidewalls of the gate electrode layer by anisotropic etching.

According to another embodiment of the disclosure a method of manufacturing a semiconductor device includes forming a stacked structure of first nanosheets and second nanosheets alternately stacked in a first direction over a substrate. The stacked structure is patterned into a fin structure extending along a second direction substantially perpendicular to the first direction. A sacrificial gate structure is formed extending in a third direction over a first portion of the first nanosheets the third direction being substantially perpendicular to both the first direction and the second direction. The sacrificial gate structure includes an oxide layer, a polysilicon layer formed over the oxide layer, and insulating sidewall spacers formed over opposing sidewalls of the polysilicon layer. Source/drain structures are formed on opposing sides of the sacrificial structure. An interlayer dielectric layer is formed over the source/drain structures. The polysilicon layer, the oxide layer, and a portion of the first nanosheets are removed. A gate structure is formed extending in the third direction over the first portion of the first nanosheets so that the gate structure wraps around the first nanosheets. The gate structure includes a gate dielectric layer and a gate electrode layer formed over the gate dielectric layer. The insulating sidewall spacers and the gate dielectric layer are removed from an upper portion of opposing sidewalls of the gate structure to form trenches on opposing sides of the gate structure, and the trenches are filled with an insulating material. In an embodiment, the method includes forming an etch stop layer over the source/drain structures and the insulating sidewall spacers before forming the interlayer dielectric layer. In an embodiment, an upper portion of the etch stop layer is removed during the removing the insulating sidewall spacers and the gate dielectric layer from an upper portion of opposing sidewalls of the gate structure. In an embodiment, the refill insulating material includes a different material than the insulating sidewall spacers and the interlayer dielectric layer. In an embodiment, the insulating sidewall spacers include first insulating sidewall spacers formed over the opposing sidewalls of the polysilicon layer, and second insulating sidewall spacers formed over the first insulating sidewall spacers, wherein the removing the insulating sidewall spacers includes removing the first insulating sidewall spacers.

According to another embodiment of the disclosure, a semiconductor device includes a stacked structure disposed over a substrate, including a plurality of spaced-apart semiconductor layers stacked in a first direction and extending in a second direction over the substrate, wherein the second direction is substantially perpendicular to the first direction. A gate electrode structure extends in a third direction wrapped around each of the plurality of spaced-apart semiconductor layers, wherein the third direction is substantially perpendicular to the first and second directions. The gate electrode structure includes a high-k gate dielectric layer disposed over the plurality of spaced-apart semiconductor layers and a metal gate electrode layer disposed over the high-k gate dielectric layer. Insulating spacers are disposed over opposing sides of the gate electrode structure. A height of the insulating spacers is 0.5% to 50% of a height of the gate electrode layer along the first direction. An insulating layer is disposed on opposing sides of an uppermost portion of the gate electrode layer. An interlayer dielectric layer is disposed over opposing sides of the insulating layer. The insulating layer include a different material than the insulating spacers, gate dielectric layer, and the interlayer dielectric layer. In an embodiment, an uppermost high-k gate dielectric layer extends along opposing sidewalls of the gate electrode layer and the uppermost high-k gate dielectric layer has a top surface at 0.5% to 50% of the height of the gate electrode layer. In an embodiment, the semiconductor device includes an etch stop layer extending in the first direction along opposing sidewalls of interlayer dielectric layer, wherein a height of the etch stop layer along the first direction is less than the height of the gate electrode layer. In an embodiment, a ratio of the height of the etch stop layer to the height of the insulating spacers ranges from about 40:1 to about 1:1. In an embodiment, the etch stop layer includes a different material than the insulating layer and the interlayer dielectric layer. In an embodiment, the insulating spacers include first spacers and second spacers, and sidewalls of the first spacers are aligned with sidewalls of the second spacers. In an embodiment, the semiconductor device includes source/drain structures below the interlayer dielectric layer. In an embodiment, the refill insulating layer includes one or more selected from the group consisting of a silicon nitride, a silicon oxide, SiCN, SiON, and SiOCN.

According to another embodiment of the disclosure, a semiconductor device includes a plurality of spaced-apart nanosheets stacked in a first direction and extending in a second direction over a substrate, wherein the second direction is substantially perpendicular to the first direction. High-k dielectric layers wrap around each of the nanosheets and metal layers wrap around each of the high-k dielectric layers. Insulating spacers are disposed over opposing sidewalls of the metal layers, wherein a height of the insulating spacers is 0.5% to 50% of a height of the metal layer along the first direction. An insulating layer is disposed on an uppermost portion of the opposing sidewalls of the metal layers, and an interlayer dielectric layer is disposed over opposing sides of the insulating layer. The insulating layer includes a different material than the insulating spacers, high-k dielectric layers, and the interlayer dielectric layer. In an embodiment, the semiconductor device includes source/drain structures disposed over opposing sides of the nanosheets. In an embodiment, the interlayer dielectric layer is disposed over the source/drain structures. In an embodiment, the semiconductor device includes an etch stop layer disposed between the interlayer dielectric layer and the source/drain structures, wherein a height of the etch stop layer above an uppermost nanosheet in the first direction is less than a height of the metal layer above the uppermost nanosheet in the first direction. In an embodiment, the etch stop layer includes a different material than the insulating layer and the interlayer dielectric layer. In an embodiment, a ratio of the height of the etch stop layer to the height of the insulating spacers along the first direction ranges from about 40:1 to about 1:1. In an embodiment, an uppermost high-k gate dielectric layer extends along opposing sidewalls of the metal layer and the uppermost high-k gate dielectric layer has a top surface at 0.5% to 50% of the height of the metal layer. In an embodiment, the semiconductor device includes inner spacers disposed between the nanosheets and the source/drain structures. In an embodiment, the insulating layer includes one or more selected from the group consisting of a silicon nitride, a silicon oxide, SiCN, SiON, and SiOCN.

According to another embodiment of the disclosure, a semiconductor device includes a plurality of semiconductor nanosheets stacked in a first direction and extending in a second direction over a substrate, wherein the second direction is substantially perpendicular to the first direction. A gate electrode structure extends in a third direction wrapping around each of the plurality of semiconductor nanosheets, wherein the third direction is substantially perpendicular to the first and second directions. The gate electrode structure includes a high-k gate dielectric layer disposed over each of the plurality of spaced-apart semiconductor nanosheets and a metal gate electrode layer disposed over the high-k gate dielectric layer. The high-k gate dielectric layer extends 1 to 20 nm above an uppermost semiconductor nanosheet along the first direction. Sidewall spacers are disposed over opposing sidewalls of the gate electrode structure. The sidewall spacers extend 1 to 20 nm above the uppermost semiconductor nanosheet along the first direction. An insulating layer is disposed on opposing sides of the uppermost portion of the gate electrode structure, and an interlayer dielectric layer is disposed over opposing sides of the insulating layer. The insulating layer includes a different material than the sidewall spacers, the gate dielectric layer, and the interlayer dielectric. In an embodiment, the sidewall spacers include first sidewall spacers disposed over opposing sidewalls of the gate electrode structure and second sidewall spacers disposed over the first sidewall spacers. In an embodiment, the semiconductor device includes source/drain structures disposed over opposing sides of the gate electrode structure, wherein the interlayer dielectric layer is disposed over the source/drain structures. In an embodiment, the semiconductor device includes an etch stop layer disposed between the interlayer dielectric layer and the source/drain structures.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:

forming a gate electrode structure over a channel region; wherein the gate electrode structure includes a gate dielectric layer disposed over the channel region, a gate electrode disposed over the gate dielectric layer, and insulating spacers disposed over opposing sidewalls of the gate electrode, wherein the gate dielectric layer is disposed over opposing sidewalls of the gate electrode;

forming an interlayer dielectric layer over opposing sidewalls of the insulating spacers;

removing the insulating spacers from an upper portion of the opposing sidewalls of the gate electrode to form trenches between the opposing sidewalls of the upper portion of the gate electrode and the interlayer dielectric layer, wherein a portion of the insulating spacers remains at a lower portion of the gate electrode and in contact with the gate dielectric layer; and filling the trenches with an insulating material.

2. The method according to claim 1, wherein the insulating material comprises a different material than the insulating spacers.

3. The method according to claim 1, wherein the insulating material comprises one or more selected from the group consisting of a silicon nitride, a silicon oxide, SiCN, SiON, and SiOCN.

4. The method according to claim 1, wherein the forming the gate electrode structure comprises:

forming a sacrificial gate electrode over the channel region;

forming the insulating spacers on sidewalls of the sacrificial gate electrode;

forming source/drain structures over opposing sides of the sacrificial gate electrode outside the insulating spacers;

removing the sacrificial gate electrode to form a gate space;

partially removing the insulating spacers; and forming the gate dielectric layer and the gate electrode in the gate space after partially removing the insulating spacers.

5. The method according to claim 4, wherein the insulating spacers include a first insulating spacer formed along the sidewalls of the sacrificial gate electrode and a second insulating spacer formed on the first insulating spacer, and wherein the partially removing the insulating spacers comprises removing the first insulating spacer.

6. The method according to claim 1, further comprising removing a portion of the gate dielectric layer along the opposing sidewalls of the gate electrode.

7. The method according to claim 1, wherein the removing the insulating spacers is performed by anisotropic etching.

8. A method of manufacturing a semiconductor device, comprising:

forming a stacked structure of first semiconductor layers and second semiconductor layers alternately stacked in a first direction over a substrate, patterning the stacked structure into a fin structure extending along a second direction substantially perpendicular to the first direction;

forming a sacrificial gate structure extending in a third direction over a first portion of the first semiconductor layers and second semiconductor layers, the third direction being substantially perpendicular to both the first direction and the second direction, wherein the sacrificial gate structure includes a sacrificial gate dielectric layer, a sacrificial gate electrode layer formed over the sacrificial gate dielectric layer, and insulating sidewall spacers formed over opposing sidewalls of the sacrificial gate electrode layer;

forming an interlayer dielectric layer over the insulating sidewall spacers;

removing the sacrificial gate electrode layer, the sacrificial gate dielectric layer, and a portion of the first semiconductor layers between adjacent second semiconductor layers;

forming a gate structure extending in the third direction over the first portion of the second semiconductor layers so that the gate structure wraps around the second semiconductor layers, wherein the gate structure includes a gate dielectric layer and a gate electrode layer formed over the gate dielectric layer, and the gate dielectric layer extends along opposing sidewalls of the gate electrode layer;

after forming the gate structure, removing the insulating sidewall spacers from an upper portion of the opposing sidewalls of the gate electrode layer to form trenches on opposing sides of the gate electrode layer; and filling the trenches with an insulating material.

9. The method according to claim 8, further comprising performing a planarizing operation after filling the trenches with the insulating material.

10. The method according to claim 8, wherein the insulating material comprises a different material than the insulating sidewall spacers and the interlayer dielectric layer.

11. The method according to claim 8, wherein:

the insulating sidewall spacers include first insulating sidewall spacers and second insulating sidewall spacers, the first insulating sidewall spacers are formed along the opposing sidewalls of the sacrificial gate electrode layer, the second insulating sidewall spacers are formed on the first insulating sidewall spacers, and a portion of the first insulating sidewall spacers is removed before the forming the gate structure.

12. The method according to claim 11, wherein the removing the insulating sidewall spacers includes removing the first insulating sidewall spacers and the second insulating sidewall spacers.

13. The method according to claim 8, further comprising:

forming source/drain structures on opposing sides of the sacrificial gate structure; and forming an etch stop layer over the source/drain structures and the insulating sidewall spacers before forming the interlayer dielectric layer.

14. The method according to claim 8, further comprising removing the gate dielectric layer from the upper portion of the opposing sidewalls of the gate electrode layer during the removing the insulating sidewall spacers from an upper portion of the opposing sidewalls of the gate electrode layer.

15. The method according to claim 14, wherein the gate dielectric layer and the insulating sidewall spacers are removed from the upper portion of the opposing sidewalls of the gate electrode layer by anisotropic etching.

16. A method of manufacturing a semiconductor device, comprising:

forming a stacked structure of first nanosheets and second nanosheets alternately stacked in a first direction over a substrate;

patterning the stacked structure into a fin structure extending along a second direction substantially perpendicular to the first direction;

forming a sacrificial gate structure extending in a third direction over a first portion of the first nanosheets the third direction being substantially perpendicular to both the first direction and the second direction, wherein the sacrificial gate structure includes an oxide layer, a polysilicon layer formed over the oxide layer, and insulating sidewall spacers formed over opposing sidewalls of the polysilicon layer;

forming source/drain structures on opposing sides of the sacrificial gate structure;

forming an interlayer dielectric layer over the source/drain structures;

removing the polysilicon layer, the oxide layer, and a portion of the first nanosheets;

forming a gate structure extending in the third direction over the first portion of the first nanosheets so that the gate structure wraps around the first nanosheets, wherein the gate structure includes a gate dielectric layer and a gate electrode layer formed over the gate dielectric layer;

removing the insulating sidewall spacers and the gate dielectric layer from an upper portion of opposing sidewalls of the gate structure to form trenches on opposing sides of the gate structure, wherein a portion of the insulating spacers and a portion of the gate dielectric layer remain at a lower portion of the gate electrode structure and the portion of the insulating sidewall spacers and the portion of the gate dielectric layer contact each other; and filling the trenches with an insulating material.

17. The method according to claim 16, further comprising:

forming an etch stop layer over the source/drain structures and the insulating sidewall spacers before forming the interlayer dielectric layer.

18. The method according to claim 17, wherein an upper portion of the etch stop layer is removed during the removing of the insulating sidewall spacers and the gate dielectric layer from an upper portion of opposing sidewalls of the gate structure.

19. The method according to claim 16, wherein the insulating sidewall spacers include first insulating sidewall spacers formed over the opposing sidewalls of the polysilicon layer, and second insulating sidewall spacers formed over the first insulating sidewall spacers.

20. The method according to claim 19, wherein the removing of the insulating sidewall spacers includes removing the first insulating sidewall spacers.

* * * * *